US007242215B2

(12) United States Patent
Snider et al.

(10) Patent No.: US 7,242,215 B2
(45) Date of Patent: Jul. 10, 2007

(54) NANOSCALE LATCHES AND IMPEDANCE-ENCODED LOGIC FOR USE IN NANOSCALE STATE MACHINES, NANOSCALE PIPELINES, AND IN OTHER NANOSCALE ELECTRONIC CIRCUITS

(75) Inventors: Gregory S. Snider, Mountain View, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 100 days.

(21) Appl. No.: 10/974,660

(22) Filed: Oct. 27, 2004

(65) Prior Publication Data

US 2006/0087344 A1   Apr. 27, 2006

(51) Int. Cl.
    *H03K 19/173*   (2006.01)
(52) U.S. Cl. .................... 326/38; 326/41; 326/104; 977/789
(58) Field of Classification Search ............ 326/38–41, 326/104, 114; 977/789
    See application file for complete search history.

(56) References Cited

U.S. PATENT DOCUMENTS

| 6,072,716 | A | 6/2000 | Jacobson et al. | |
| 6,518,156 | B1 | 2/2003 | Chen et al. | |
| 6,586,965 | B2 | 7/2003 | Kuekes | |
| 6,873,540 | B2 * | 3/2005 | Krieger et al. | 365/151 |
| 2002/0172064 | A1 * | 11/2002 | Chen | 365/1 |
| 2003/0003674 | A1 | 1/2003 | Hsu et al. | |
| 2003/0089899 | A1 * | 5/2003 | Lieber et al. | 257/9 |
| 2004/0041617 | A1 * | 3/2004 | Snider et al. | 327/365 |
| 2004/0160807 | A1 | 8/2004 | Rinerson et al. | |
| 2004/0160819 | A1 | 8/2004 | Rinerson et al. | |
| 2004/0245547 | A1 * | 12/2004 | Stipe | 257/200 |
| 2005/0017759 | A1 * | 1/2005 | Weber et al. | 327/10 |

OTHER PUBLICATIONS

Collier, C.P., et al., "Electronically Configurable Molecular-Based Logic Gates," Science, vol. 285, Jul. 16, 1999, pp. 391-394.

Goldstein, Seth, et al., "NanoFabrics: Spatial Computing Using Molecular Electronics," Proc. of the 28th Annual Int'l Symposium on Computer Architecture Jun. 2001.

Luo, Yi, et al., "Two-Dimensional Molecular Electronics Circuits," Chemphyschem 2002, 3, 519-525, no month.

Chen, Yong, et al., "Nanoscale Molecular-Switch Crossbar Circuits," (abstract), Nanotechnology Issue 4, Apr. 2003, pp. 462-468.

(Continued)

Primary Examiner—Don Le

(57) ABSTRACT

Various embodiments of the present invention are directed to implementation and use of logic-state-storing, impedance-encoded nanoscale, impedance-encoded latches that store logic values as impedance states within nanoscale electronic circuits that employ impedance-driven logic. In certain of these embodiments, use of nanoscale, impedance-encoded latches together with nanoscale electronic circuits that employ impedance-driven logic avoids cumulative degradation of voltage margins along a cascaded series of logic circuits and provides for temporary storage of intermediate logic values, allowing for practical interconnection of nanowire-crossbar-implemented logic circuits through nanoscale, impedance-encoded latches to other nanowire-crossbar-implemented logic circuits in order to implement complex, nanoscale-logic-circuit pipelines, nanoscale-logic-circuit-based state machines, and other complex logic devices with various different interconnection topologies and corresponding functionalities.

21 Claims, 33 Drawing Sheets

OTHER PUBLICATIONS

Stan, Mircea R., et al., "Molecular Electronics: From Devices and Interconnect to Circuits and Architecture," Proc. of the IEEE, vol. 91, No. 11, Nov. 2003.

Stewart, D.R., et al., "Molecule-Independent Electrical Switching in Pt/Organic Monolayer/Ti Devices," (abstract), Nano Letters 4(1), pp. 133-136, 2004, no month.

Snider, Greg, et al., "CMOS-Like Logic in Defective, Nanoscale Crossbars," Nanotechnology 15 (2004), pp. 881-891, no month.

Kuekes, Philip J., et al., "The Crossbar Latch: Logic Value Storage, Restoration, and Inversion in Crossbar Circuits," (abstract), Journal of Applied Physics, vol. 97, 2005, no month.

* cited by examiner

NANOSCALE LATCHES AND IMPEDANCE-ENCODED LOGIC FOR USE IN NANOSCALE STATE MACHINES, NANOSCALE PIPELINES, AND IN OTHER NANOSCALE ELECTRONIC CIRCUITS

TECHNICAL FIELD

The present invention is related to nanoscale electronics and, in particular, to nanoscale latches and methods for using impedance-encoded nanoscale latches in impedance-driven, nanoscale logic.

BACKGROUND OF THE INVENTION

Years of research and development efforts have led to significant achievements in the nanoscale electronics field. Nanoscale electronics generally refer to electronic circuits, fabricated by any of various methods, which include signal lines with widths less than 100 nm and active and passive electronic components, each fabricated from one to tens or hundreds of molecules. In one promising nanoscale electronic circuit architecture, nanowire crossbars are fabricated from a first set of closely spaced, parallel nanowires overlaid by a second set of closely spaced, parallel nanowires, with electronic components, such as diodes, resistors, and passive connections fabricated within the overlap regions, or nanowire junctions, where nanowires from the first set of nanowires cross nanowires from the second set of nanowires.

FIGS. 1A–C illustrate a simple, generic nanowire crossbar. FIGS. 1A–C all employ the same illustration conventions, described only with reference to FIG. 1A, for the sake of brevity. In FIG. 1A, a first set of parallel nanowires is represented by vertical lines 102–105 and a second set of parallel nanowires is represented by horizontal lines 106–108 and 110–111. The two sets of parallel nanowires, together with nanoscale electronic components selectively fabricated at certain nanowire junctions between nanowires of the first and second sets, compose an example nanowire crossbar 100. In FIG. 1A, nanoscale electronic components are represented by disks 112–117. The nanoscale electronic components include nanoscale diodes, nanoscale resistors, nanoscale connection points, and nanoscale transistors.

FIG. 1B shows operation of an electronic circuit implemented by a nanowire crossbar. A first group of the second set of nanowires, such as nanowires 106–108 in the example nanowire crossbar of FIGS. 1A–C, may serve as input signal lines, and a second group of the second set of nanowires, such as nanowire 110 in the example nanowire crossbar of FIGS. 1A–C, may serve as output signal lines. The example nanowire crossbar 100 of FIGS. 1A–C implements a nanoscale logic circuit into which a 3-bit signal is input and from which a 1-bit signal is output Nanowire crossbars generally include from tens to hundreds of parallel nanowires in each of the first and second parallel nanowire sets, which may be partitioned more or less arbitrarily between input, output, and internal signal lines. This partitioning occurs by interconnection of the nanowires to additional signal lines and circuitry. The logic function of the nanowire crossbar is determined by selective fabrication of nanoscale electronic components 112–117 at particular nanowire junctions within the nanowire crossbar. In certain types of nanowire crossbars, the nanowire junctions may be reprogrammable. The electronic circuit implemented by reprogrammable nanowire crossbars can therefore be repeatedly redefined. As shown in FIG. 1B, when the input "101" is encoded as high and low voltages and input to input signal lines 106–108 of the example nanowire crossbar illustrated in FIGS. 1A–C, the signal "1" is output on output signal line 110.

FIG. 1C shows a different logical-input/logical-output pair from that shown in FIG. 1B. In FIG. 1C, the example nanowire crossbar transforms the input signal "100" to output signal "0." A full logic description for the example nanowire crossbar would consist of a table of possible logical-input/logical-output pairs, or, alternatively, one or more Boolean expressions from which the possible logical-input/logical-output pairs can be derived. In general, a nanowire crossbar can be used to implement arbitrary logical circuits that transform an input logic signal of an arbitrary width, in signal lines or bits, to an output logic signal of an arbitrary width.

Nanowire crossbars employing diode-like nanoscale components at nanowire junctions have been proposed as important logic components of a new generation of nanoscale electronics. Diode-resistor logic inherently degrades signals because of voltage drops across diodes and pullup and pulldown resistors. Cascading diode logic produces cumulative signal degradation that, when diode logic is cascaded to any significant depth, produces sufficient signal degradation to make such cascaded logic circuits unusable. Since signal degradation is cumulative through each and every diode-resistor logic stage, amplification of degraded signals between diode-resistor logic stages is needed to restore signal integrity. Diode-resistor logic also lacks the ability to store logic states, so that implementation of sequential diode-resistor logic is difficult.

SUMMARY OF THE INVENTION

Various embodiments of the present invention are directed to implementation and use of logic-state-storing, impedance-encoded nanoscale latches that store logic values as impedance states within nanoscale electronic circuits that employ impedance-driven logic. In certain of these embodiments, use of nanoscale latches together with nanoscale electronic circuits that employ impedance-driven logic avoids cumulative degradation of voltage margins along a cascaded series of logic circuits and provides for temporary storage of intermediate logic values, allowing for practical interconnection of nanowire-crossbar-implemented logic circuits through nanoscale latches to other nanowire-crossbar-implemented logic circuits in order to implement complex, nanoscale-logic-circuit pipelines, nanoscale-logic-circuit-based state machines, and other complex logic devices with various different interconnection topologies and corresponding functionalities.

DETAILED DESCRIPTION OF THE INVENTION

Various embodiments of the present invention are directed to constructing and using nanoscale impedance-encoded latches ("NIELs") for storing logic states produced and consumed by nanoscale impedance-driven logic circuits ("NIDLCs"). NIELs enable NIDLCs to be cascaded to create more complex logic functions than are possible in a single stage of logic. Signals degraded in passing through impedance-driven logic stages can be boosted, or restored, through operation of one or more intervening NIELs. The NIDLCs and intervening NIELs can be clocked to produce pipelines, state machines, and more complex logic circuits. The following discussion provides general information and both an overview and details of the present invention in a number of subsections, including: (1) hysteretic resistors; (2) NIELs; (3) latch arrays; (4) diode-resistor logic; (5) impedance-driven logic; (6) an impedance-encoded and impedance-driven logic stage; (7) pipelines; (8) pipeline operation; (9) state machines; (10) an example state machine; and (11) operation of the example state machine.

Hysteretic Resistors

Figure 1A:
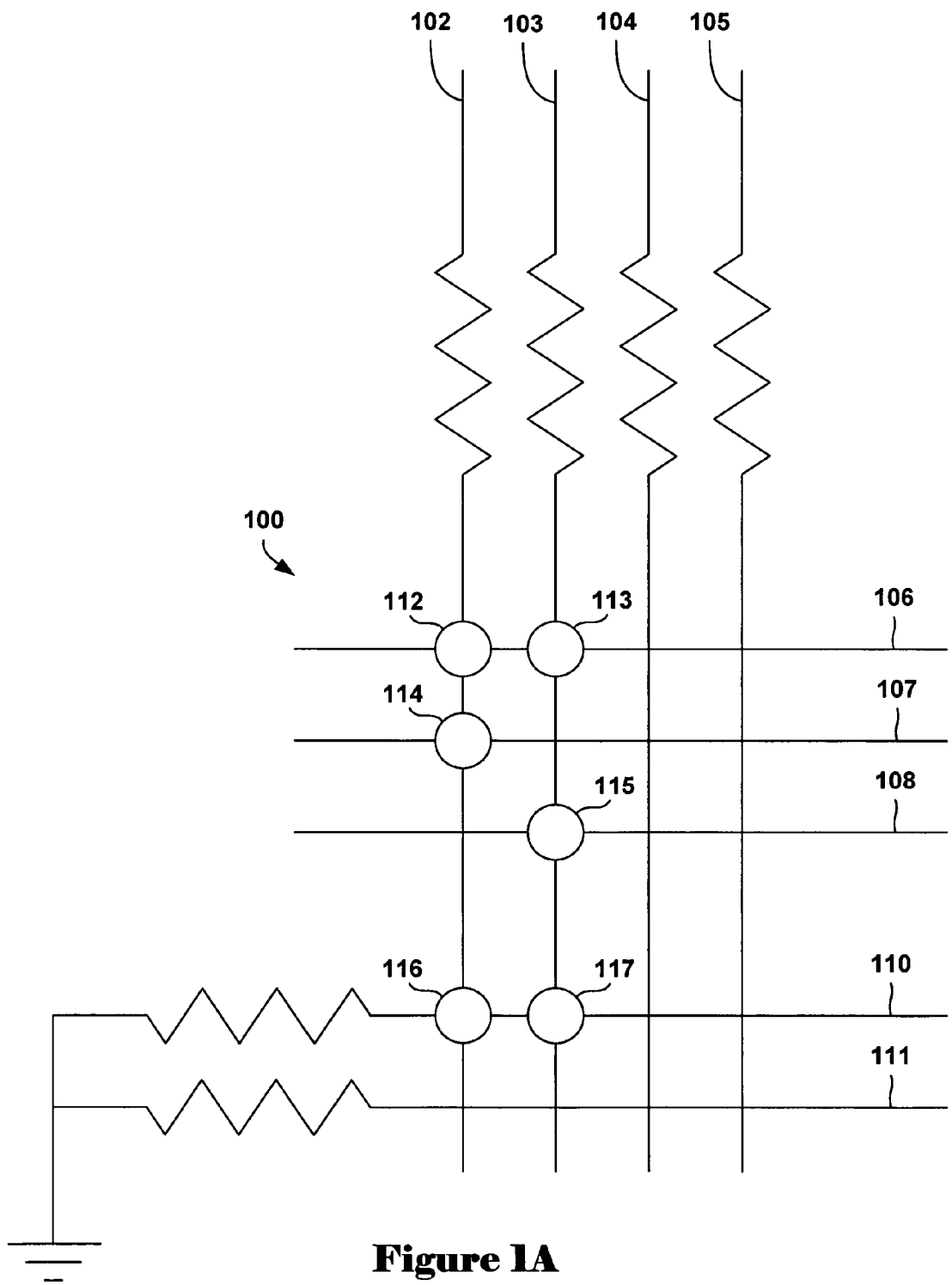
FIGS. 1A–C illustrate a simple, generic nanowire crossbar.
Figure 1B:
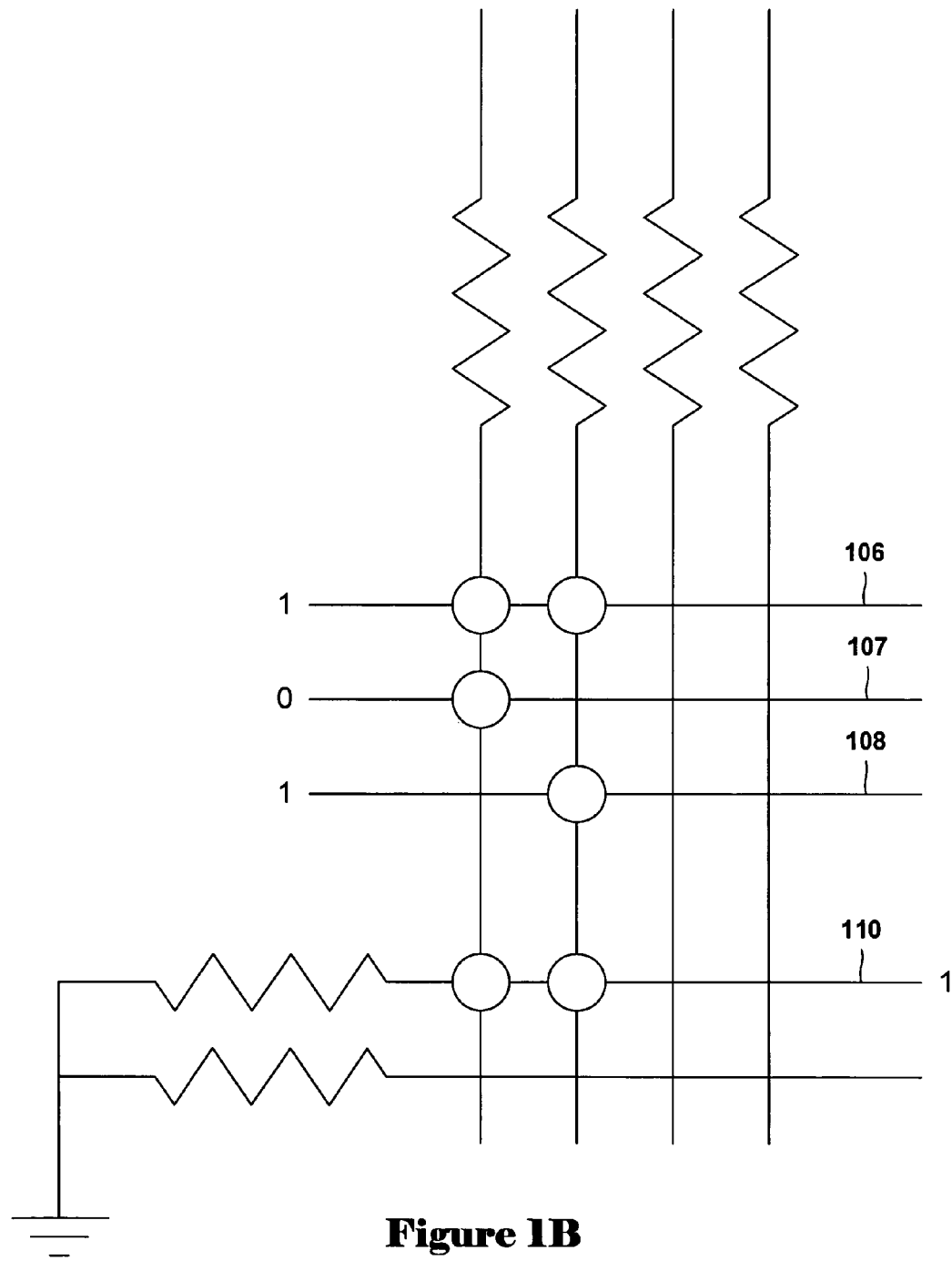
Figure 1C:
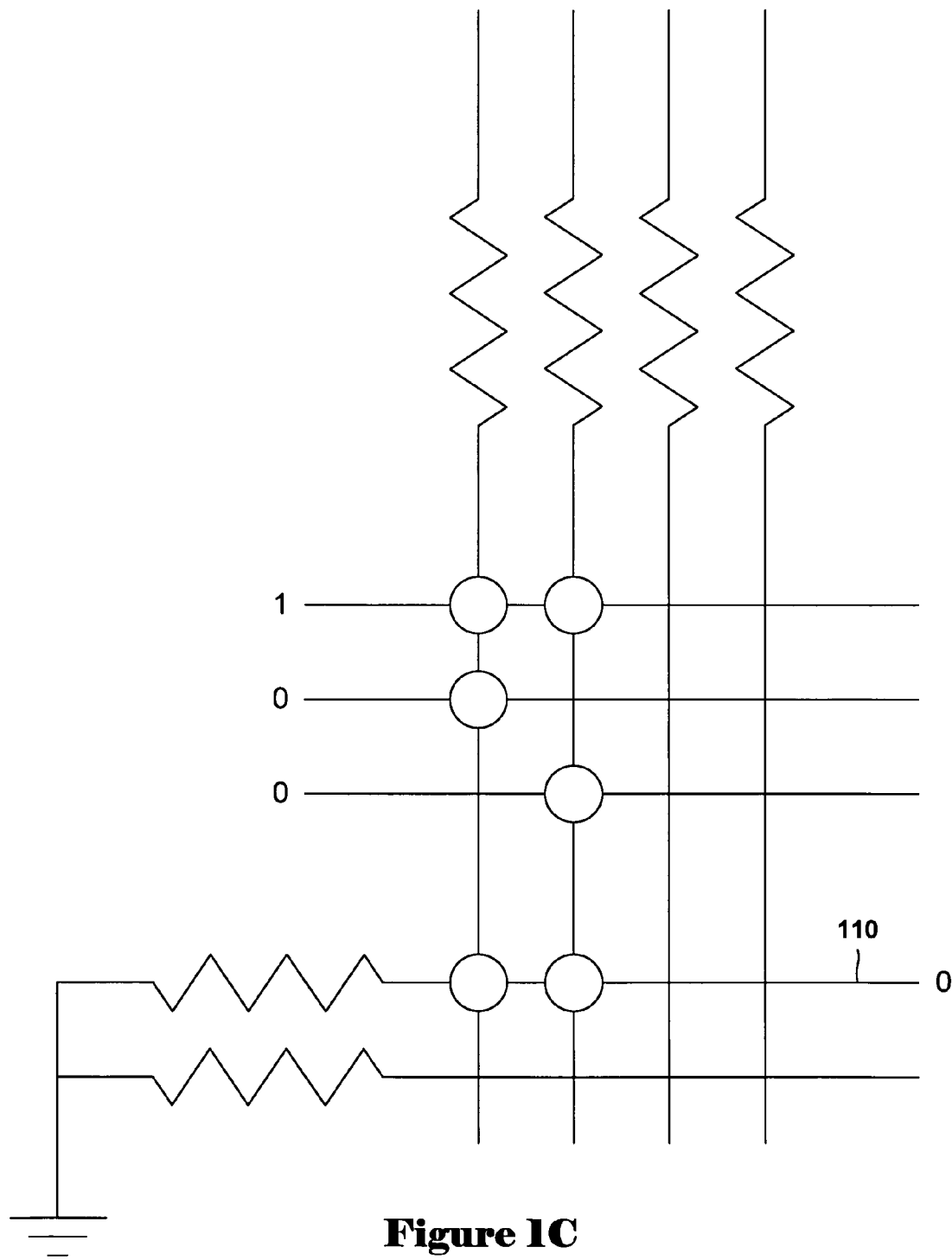
Figure 2:
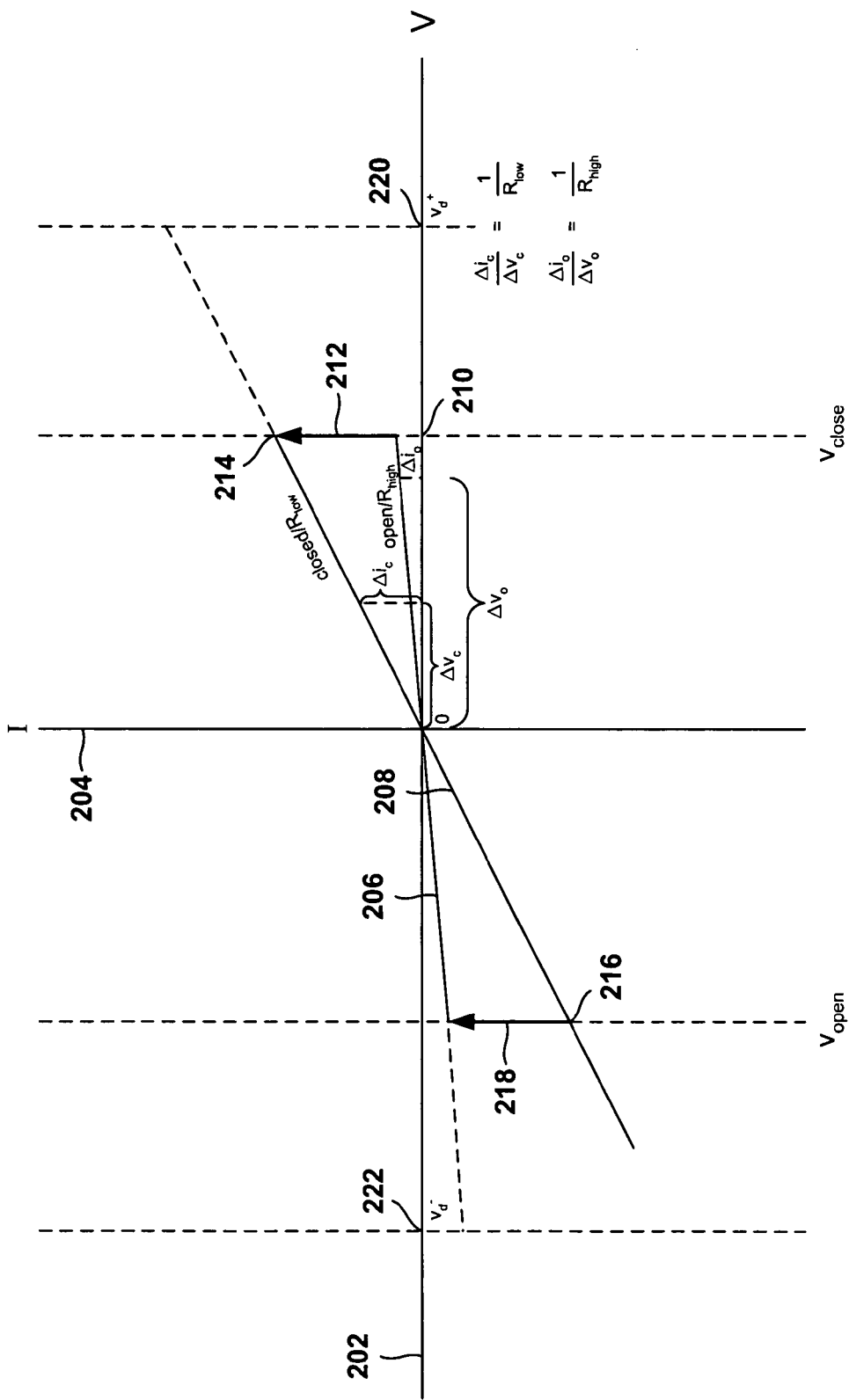
FIG. 2 illustrates the electronic behavior of a nanoscale hysteretic resistor that can be fabricated at a nanowire junction interconnecting two nanowires.

FIG. 2 illustrates the electronic behavior of a nanoscale hysteretic resistor that can be fabricated at a nanowire junction interconnecting two nanowires. In FIG. 2, voltage is plotted with respect to the horizontal axis 202, and current is plotted with respect to the vertical axis 204. Plotted current/voltage relationships, straight line segments in FIG. 2, form an operational loop in FIG. 2 describing switching the nanoscale hysteretic resistor from a low-impedance logic-state 0 (402 and 403 in FIG. 4A) to a high-impedance logic-state 1 (404 and 405 in FIG. 4A) and back again. The relatively slightly inclined line segment 206 represents the current/voltage relationship for the nanoscale hysteretic resistor in the high-impedance, logic-state 1, open condition. The small slope of line segment 206 represents the relatively small change in current with change in applied voltage of a high-impedance, or open, switch, as expressed by Ohms law:

$$\frac{\Delta i_c}{\Delta V_c} = \frac{1}{R_{open}}$$

$R_{closed}$ is relatively low, as discussed above, leading to a large current-change-to-voltage-change ratio. The relatively highly inclined line 208 represents the low-impedance, logic-state 0, closed state of the nanoscale hysteretic resistor, in which a relatively small change in applied voltage induces a relatively large current change, as expressed by Ohms law:

$$\frac{\Delta i_c}{\Delta V_c} = \frac{1}{R_{closed}}$$

In the open, high-impedance state represented by line segment 206, the amount of current passed through the nanoscale hysteretic resistor remains fairly constant until a positive applied voltage $V_{close}$ is reached at point 210 on the voltage axis. At that point, the nanoscale hysteretic resistor experiences a impedance-state change, during which the amount of current that passes through the nanoscale hysteretic resistor greatly increases, along vertical line segment 212, to a point 214 at which the vertical line segment 212 intersects the inclined line segment 208 representing the current/voltage relationship for of the nanoscale hysteretic resistor in the low-impedance, closed state. An increase in applied positive voltage above $V_{close}$ would induce an increase in current corresponding to extension of inclined line 208 in a positive direction. If the applied voltage is decreased, the current passing through the nanoscale hysteretic resistor correspondingly decreases, descending line segment 208 to point 216. At point 216, representing a negative applied voltage $V_{open}$, the current passing through the hysteretic resistor rapidly decreases, along vertical 218, to intersect the slightly inclined line 206 representing the high-impedance, open state. Thus, at negative applied voltage $V_{open}$, the hysteretic resistor experiences a state change from the low-impedance, closed state to the high-impedance, open state. Application of larger negative voltages than $V_{open}$ would cause current increase, in the negative direction, as represented by an extension of line segment 208 in the negative-voltage direction.

In general, the nanoscale hysteretic resistor is operated in a voltage range from somewhat below negative voltage $V_{open}$ to somewhat above positive voltage $V_{close}$, because applied voltages outside a range of $V_d^+$ 220 to $V_d^-$ 222, where $V_d^+$ is a positive destruction voltage at or above which the hysteretic resistor fails and $V_d^-$ is a negative destruction voltage at or below which the hysteretic resistor fails, may irreversibly destroy the nanoscale hysteretic resistor. The logic state, or impedance state, of a hysteretic-resistor-containing NIEL can be determined by applying a voltage across the nanowires interconnected by the nanoscale hysteretic resistor, in series with a resistor, and determining the current-flow or voltage drop across the nanoscale hysteretic resistor. A large voltage drop, or small current, indicates the nanoscale hysteretic resistor is in an open, high-impedance state, while a relatively lower voltage drop, or relatively higher current, indicates that the nanoscale hysteretic resistor is in a low-impedance, closed state.

Depending on the physical characteristics of particular nanoscale hysteretic-resistor implementations, both the magnitudes and polarities of $V_{open}$ and $V_{close}$ may vary. For example, nanoscale hysteretic-resistor implementations in which $V_{open}$ is a positive voltage and $V_{close}$ is a negative voltage, or, in other words, in which the polarities of the $V_{open}$ and $V_{close}$ voltages are inverted with respect to the above described hysteretic resistor, are possible. The magnitudes of $V_{open}$, $V_{close}$, $V_d^+$, and $V_d^-$ may also vary substantially between different implementations.

Impedance-Encoded Latches

Figure 3:
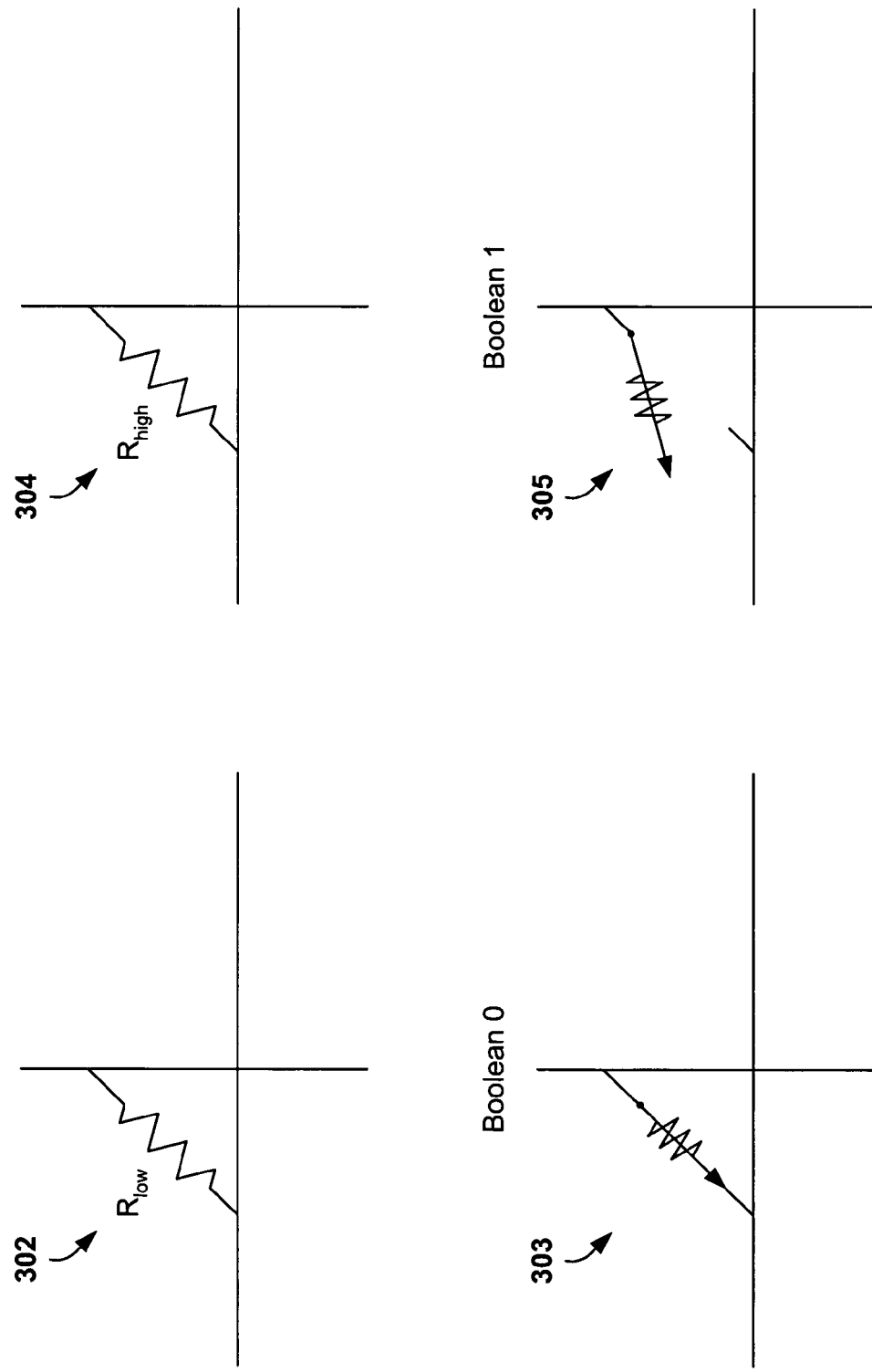
FIG. 3 illustrates how a hysteretic resistor is employed, in various embodiments of the present invention, to implement nanoscale latches.

FIG. 3 illustrates how a hysteretic resistor is employed, in various embodiments of the present invention, to implement NIELs. The nanoscale hysteretic resistor 302 can be electrically controlled to occupy one of two different impedance states 302 and 304. In a first state 302, the impedance of the nanoscale hysteretic resistor is relatively low, providing interconnection of the two nanowires through a low-impedance connection. In the following discussion, this state is arbitrarily designated as the Boolean value "0" impedance-logic state, represented as a closed hysteretic resistor switch 303 in a schematic representation. The second state that may be occupied by the nanoscale hysteretic resistor is a relatively high-impedance state 304. The relatively high-impedance state is arbitrarily designated as Boolean logic state "1," represented as an open hysteretic resistor switch 305 in a schematic representation. The nanoscale hysteretic resistor therefore stores logic states as impedance states, rather than as current levels or voltage potentials. The low-impedance state 302 essentially represents a low-impedance interconnection between the two nanowires, while the high-impedance state can be considered to be essentially a lack of interconnection between the two nanowires, and thus represented schematically as an open switch 305.

Figure 4A:
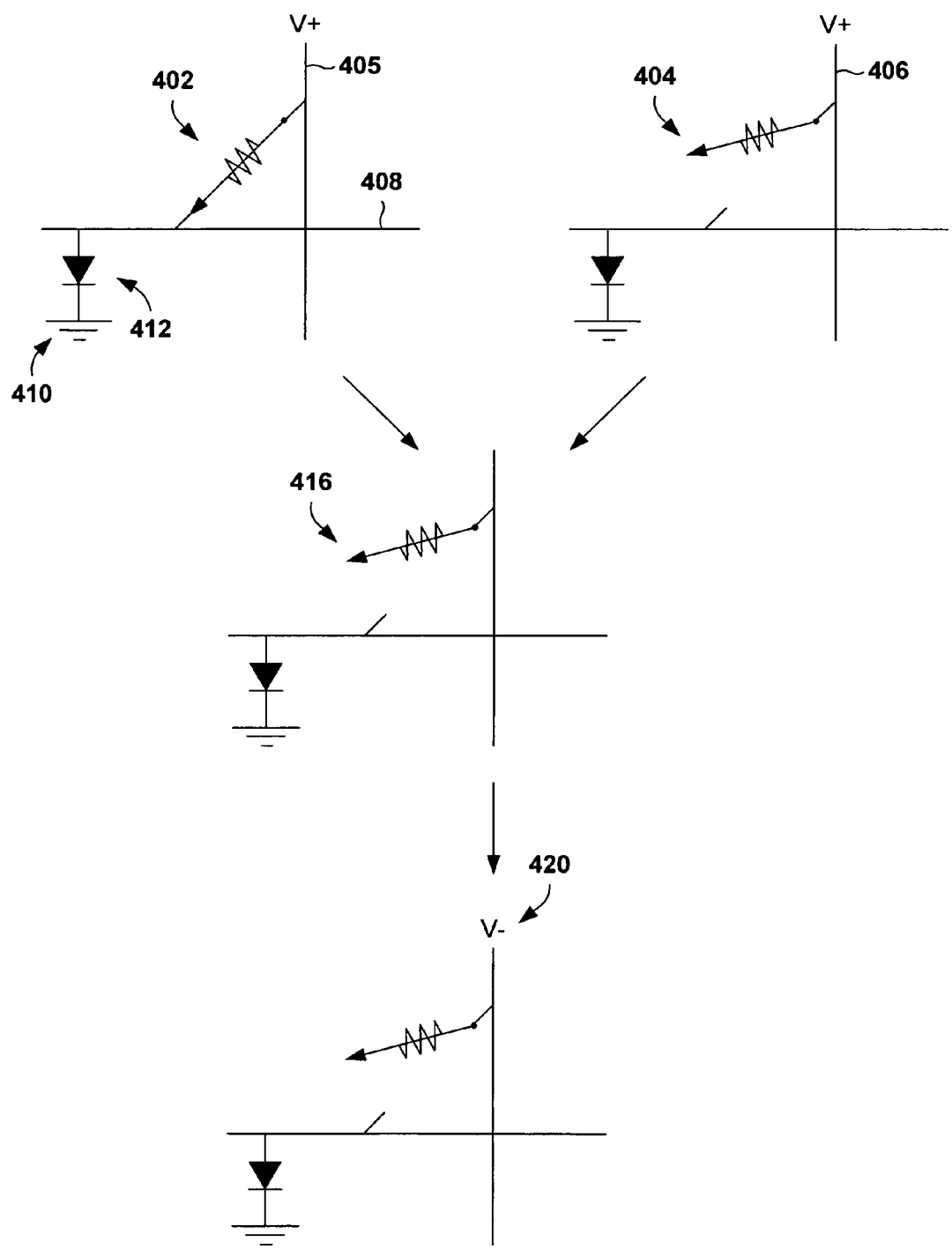
FIGS. 4A–C illustrate the use of a nanoscale hysteretic resistor as a single-element, nanoscale latch.
Figure 4B:
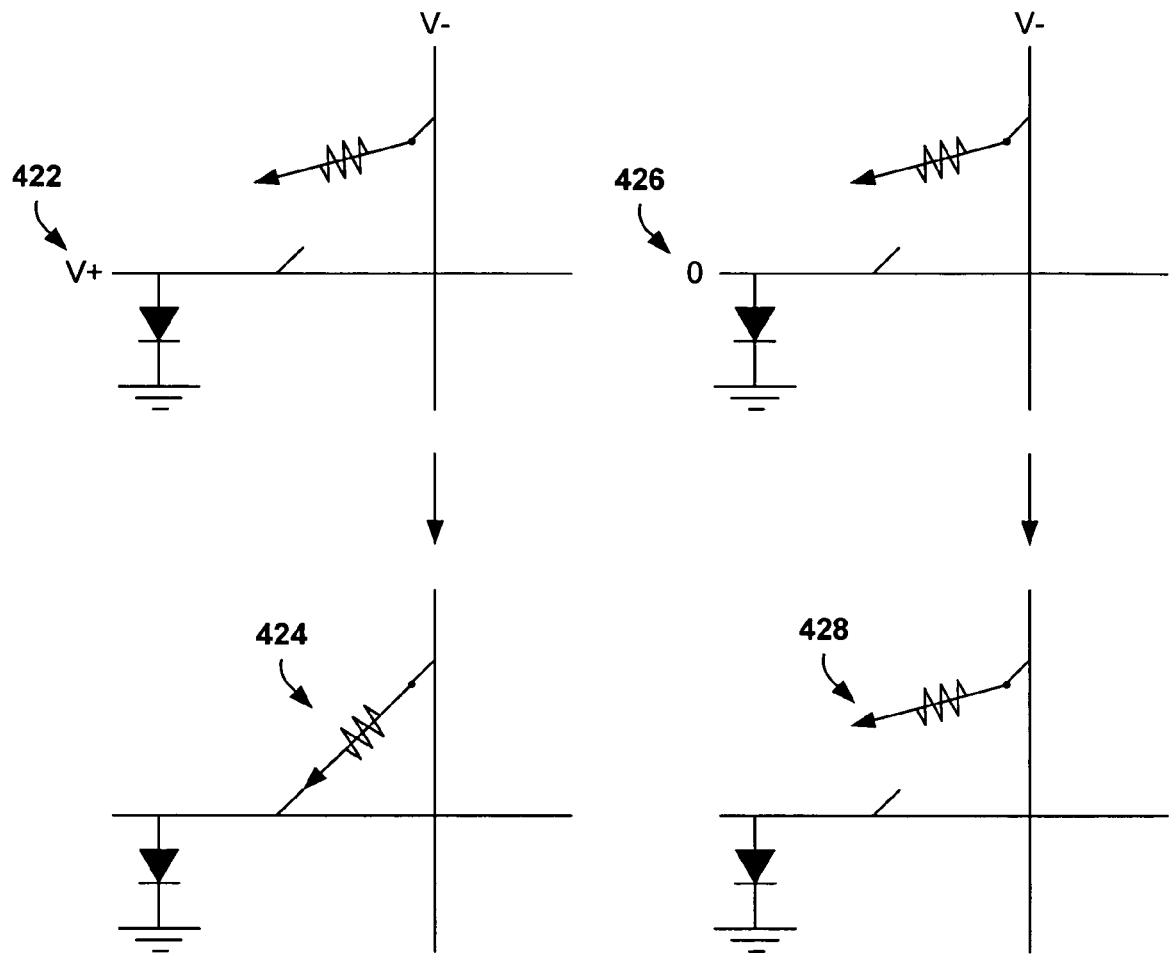
Figure 4C:
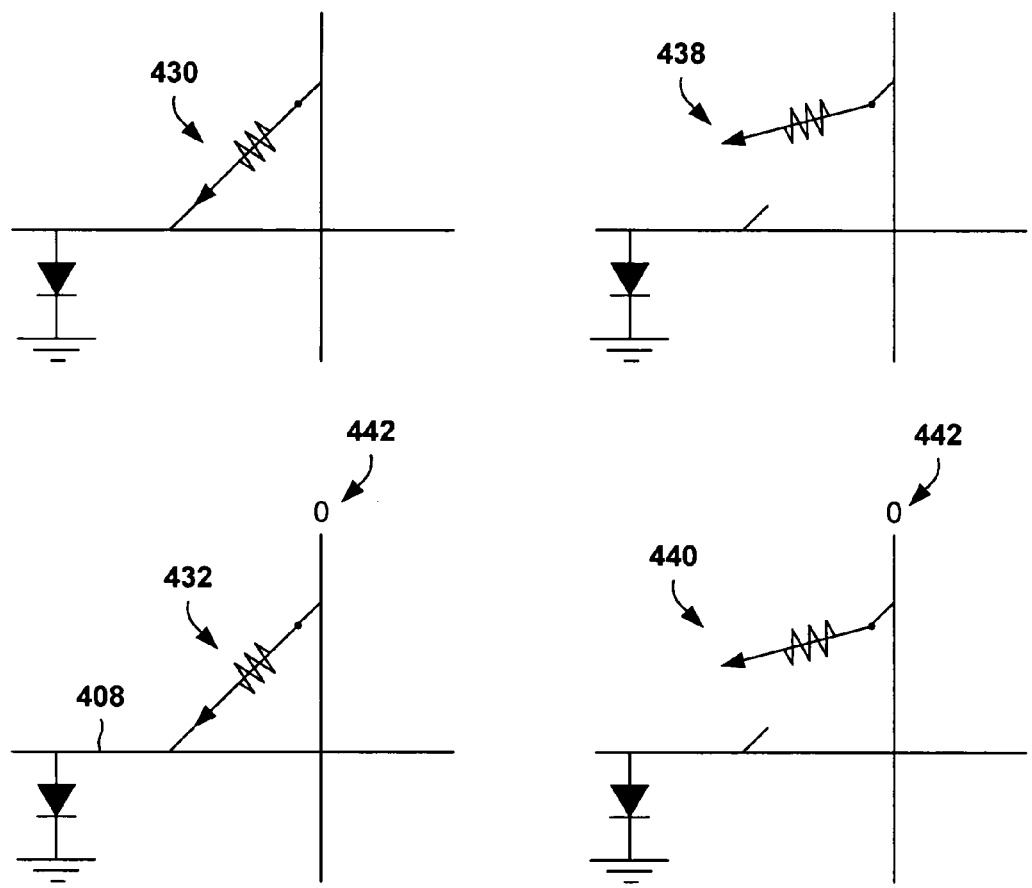

FIGS. 4A–C illustrate use of a nanoscale hysteretic resistor as a single-logic-storage-element NIEL. In FIGS. 4A–C the switch-like schematic representation of a nanoscale hysteretic resistor (303 and 305 in FIG. 3) is employed to show the impedance state or logic state of the device at different points in time. Initially, the single-element NIEL contains a previous logic-state value, or context, that may no longer be needed. Thus, as shown in FIG. 4A, the NIEL may either be in a closed state 402 or in an open state 404. Whether in a closed or open state, a relatively large, positive voltage is applied to the vertical nanowire 405 and 406, in a first step, to provide a negative voltage drop across the nanoscale hysteretic resistor more negative than $V_{open}$.

Applying a large positive voltage creates a possibility for buildup of a destructive negative potential across the nanoscale hysteretic resistor. This possibility is relieved by the interconnecting the horizontal nanowire 408 to ground 410 through a diode 412. The diode 412 is forward biased only during this first step, and provides a low impedance path to ground needed to protect the hysteretic resistor. Were the input signal only grounded through an input resistance to ground, then, when the hysteretic resistor is initially closed, a voltage divider results, forcing the negative voltage applied to the vertical nanowire to be greater in magnitude than $V_{open}$ in order to produce a voltage drop of $V_{open}$ across the hysteretic resistor in order to open the switch. But in applying a negative voltage greater in magnitude than $V_{open}$ to the vertical nanowire and opening the switch to the high impedance state, the current through the voltage divider drops rapidly and nearly all of the applied negative voltage is now dropped across the hysteretic resistor. When the applied negative voltage exceeds $V_d^-$ in magnitude, the hysteretic resistor may be irreversibly destroyed. The diode 412 thus provides a low impedance path that prevents the junction voltage from spiking destructively when the junction makes the transition to the high impedance state.

Figure 5:
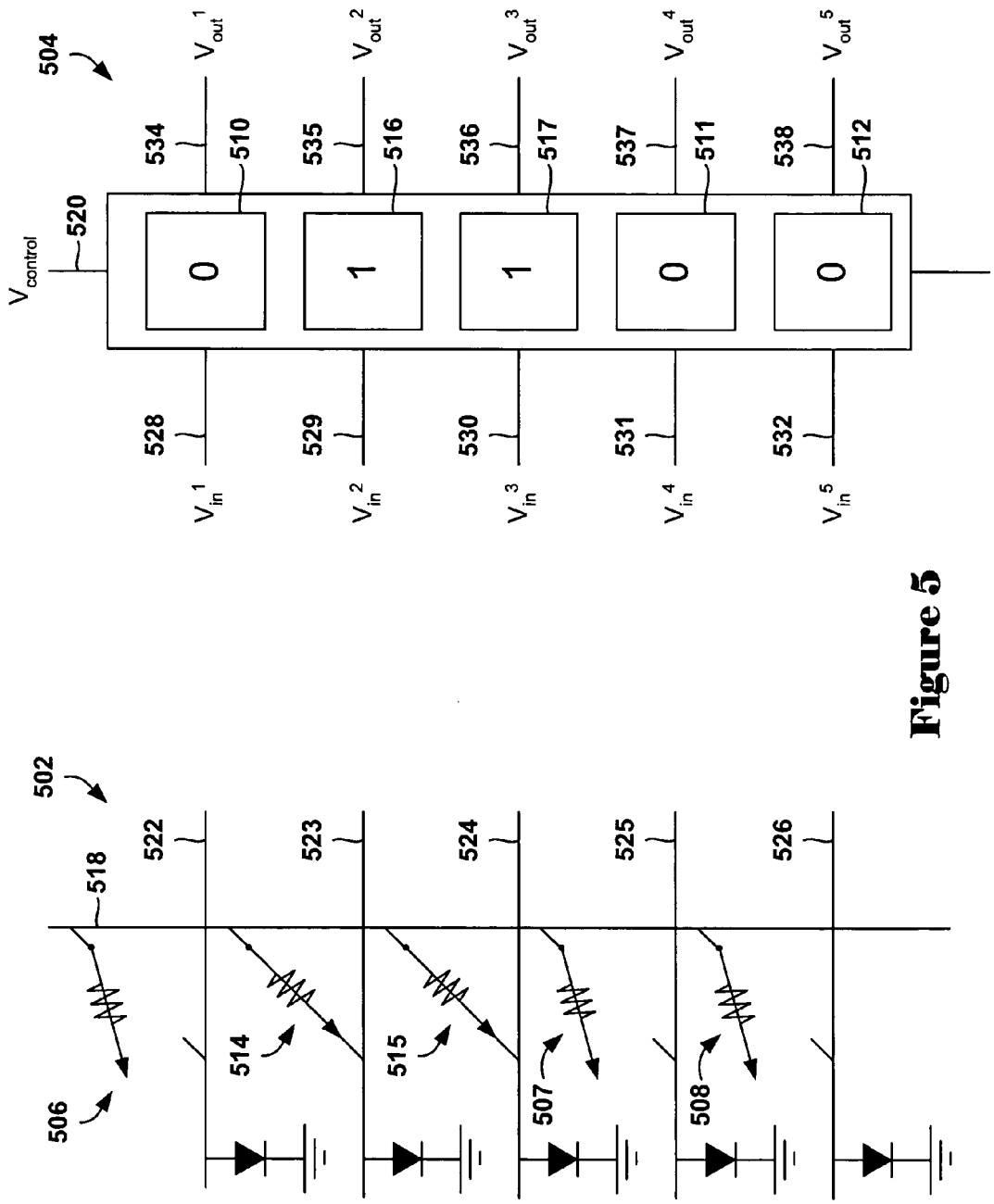
FIG. 5 shows a 5-element nanoscale latch implemented by a series of single-element nanoscale latches.

Application of the relatively large, positive voltage 405 and 406 to the vertical wire, or control-voltage input, of the NIEL forces the nanoscale hysteretic resistor into the open state 416 along the vertical line segment 518 in FIG. 5 that connects the closed-state, low-impedance line segment 208 with the open-state, high-impedance line segment 206 in FIG. 2. Thus, regardless of the initial logic state of the NIEL, the NIEL is placed into an open logic state by application of the positive voltage 405 and 406.

Next, a negative voltage 420 is applied to the vertical wire. This negative applied voltage introduces a positive voltage across the nanoscale hysteretic resistor less than positive voltage $V_{close}$. Therefore, the applied negative voltage 420 does not raise the voltage potential across a nanoscale hysteretic resistor to the point where the state transition represented by curve 512 in FIG. 5 occurs. The NIEL is now ready to receive an input value.

After the NIEL has been prepared to receive an input value, as shown in FIG. 4A, an input value can be introduced onto the horizontal nanowire, or input/output nanowire signal line, and stored in the NIEL, as shown in FIG. 4B. When a positive voltage is applied to the horizontal nanowire 422 such that the positive voltage drop across the nanoscale hysteretic resistor exceeds $V_{close}$, forcing the state transition represented by line segment 212 in FIG. 2 to place the hysteretic nanoscale impedance in the closed state 424. If a low voltage or no voltage is applied to the horizontal nanowire 426, then the nanoscale hysteretic resistor remains in the open state 428. In other words, the negative voltage applied to the vertical nanowire that places the NIEL into an input-receptive state is sufficiently low in magnitude so that the negative voltage across the nanoscale hysteretic resistor remains safely below the magnitude of $V_{close}$, but is of sufficiently high magnitude that the additional potential resulting from application of a relatively high voltage logic input signal 422 to the horizontal nanowire results in raising the total potential applied to the nanoscale hysteretic resistor to $V_{close}$. As shown in FIG. 4C, the NIEL, when prepared to receive an input value, stores an input positive-voltage, logic-state "1" signal as a closed-switch state 430, and stores an input no-voltage, logic-state "0" signal as an open switch 438. When 0 V is applied to the vertical nanowire 442, or, in other words, the vertical nanowire is forced to ground, the logic state stored in the NIEL can influence the voltage state of the horizontal nanowire. In the closed state 432, voltage applied to the horizontal nanowire 408 has a low-impedance pathway to ground through the closed switch, while, in the open state 440, there is no low-impedance path to ground within the NIEL. Thus, the effect of the absence or presence of a low-impedance path within the NIEL to ground may affect the voltage state of the horizontal nanowire.

In summary, as shown in FIG. 4A, the NIEL is prepared to receive input by first applying, to the control-voltage input, a positive voltage to unconditionally open the NIEL, regardless of its initial impedance state, and by then applying a negative voltage to place the latch into an input-receptive state. In the input-receptive state, as shown in FIG. 4B, a high-voltage input signal forces the nanoscale hysteretic resistor to transition to a closed state, while input of a low-voltage or no-voltage signal forces the nanoscale hysteretic resistor to remain in the open state. As discussed below, the impedance state of a NIEL can also be used to influence the voltage state of a signal line in a following nanowire-crossbar logic device with which the NIEL is interconnected.

Latch Arrays

FIG. 5 shows a 5-element NIEL array implemented by a series of single-element NIELs. In FIG. 5, the schematic diagram 502 for the 5-element NIEL array is shown to be equivalent to a block-diagram like representation 504 of the 5-element NIEL array. The later representation is employed in subsequent figures for the sake of clarity. Note that the open-state nanoscale hysteretic resistors, including nanoscale hysteretic resistors 506, 507, and 508 are arbitrarily designated as represent storing logic values "1" 510, 511, and 512, while closed-state nanoscale hysteretic resistors 514 and 515 are arbitrarily designated as storing logic values "0" 516 and 517, as discussed above. The vertical nanowire 518 corresponds to a control input 520, and the horizontal nanowires 522–526 correspond both to input signal lines 528–532 and output signal lines 534–538. It is important to note that the input/output signal lines can only serve as input lines or as output lines at a particular instance in time, their state with regard to input and output depending on the voltage applied to the control-voltage input 520 and on whether or not the lines are driven by additional circuitry not shown.

Conventional Diode-Resistor Logic

Figure 6B:
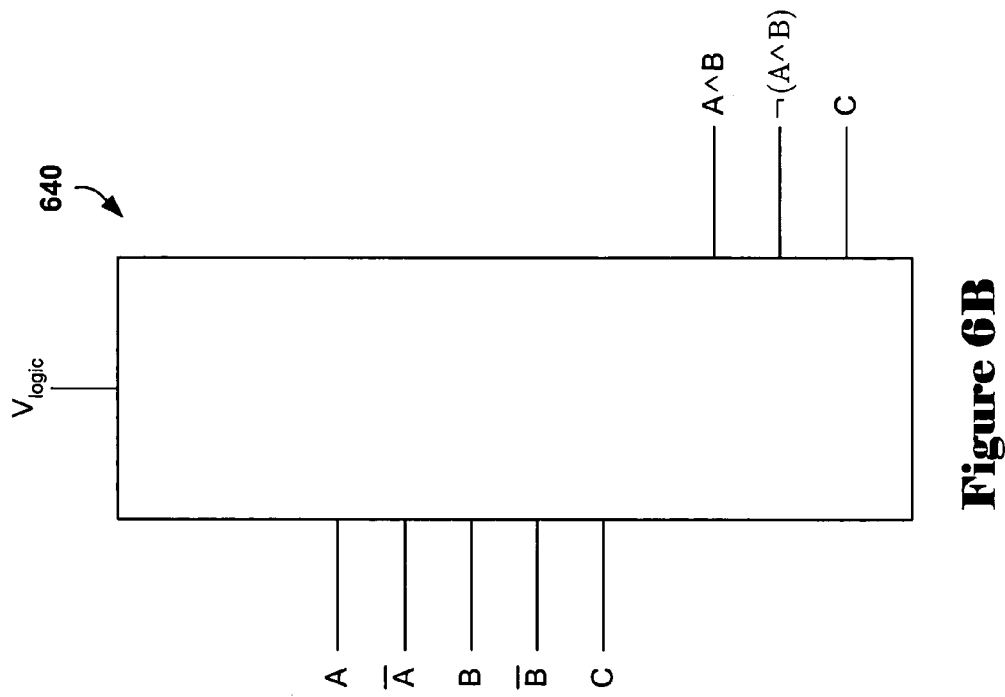
FIGS. 6A–B show a schematic illustration of a simple, example nanowire crossbar that contains diode components that implement a simple logic circuit, and a corresponding block-diagram-like representation of the logic circuit.
Figure 6A:
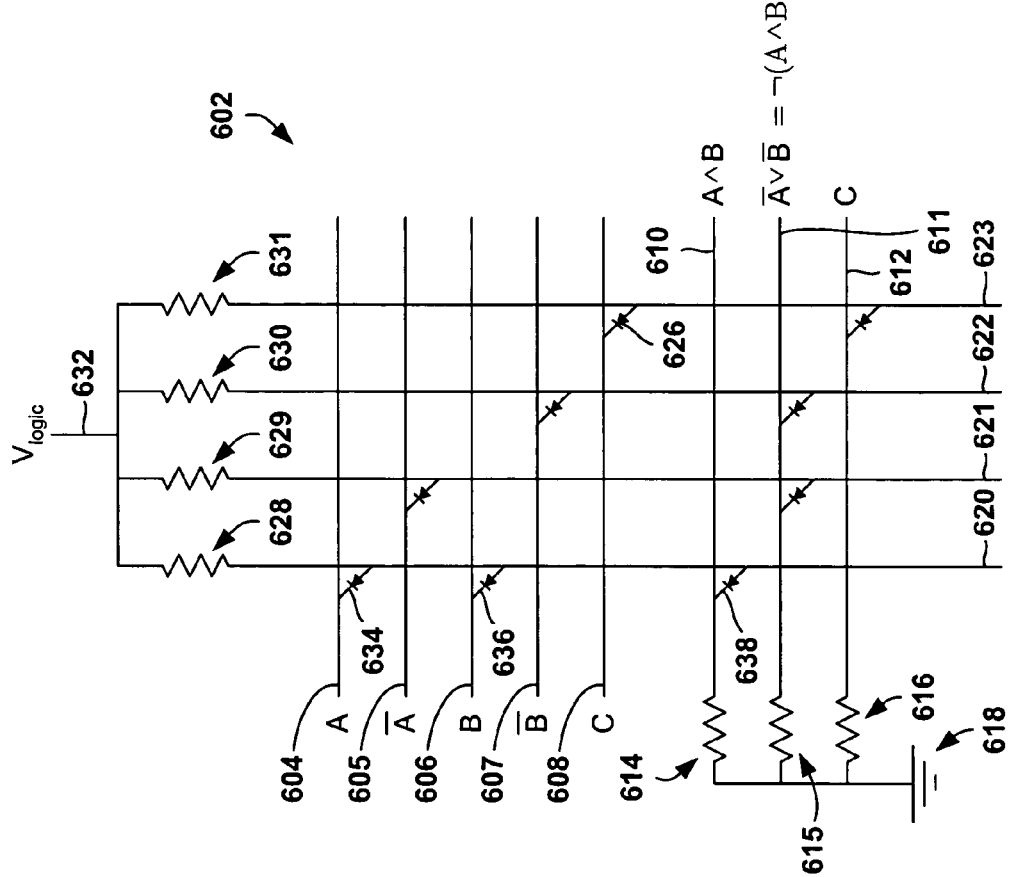

FIGS. 6A–B show a schematic illustration of a simple, example crossbar that contains diode components that implement a simple logic circuit using conventional diode logic, and a corresponding block-diagram-like representation of the logic circuit. The schematic representation 602 of the nanoscale circuit shows five input signal lines 604–608, three output signal lines 610–612 interconnected through resistors 614–616 to ground 618, and four vertical nanowires 620–623 interconnected with the input signal lines 604–608 and output signal lines 610–612 through diodes, such as diode 626. The vertical nanowires are also interconnected via resistors 628–631 to a driving voltage line 632. Selective insertion of diodes between the signal lines and vertical wires produces the logic shown in FIG. 6. Because it is difficult to implement diode-based crossbars that invert logic signals, each of input signals A 604 and B 606 is paired with a complementary input signal $\overline{A}$ 605 and $\overline{B}$ 607. Input signal C is not provided with a complementary input signal in the hypothetical logic circuit, because the complementary signal is not needed in this hypothetical application.

The nanoscale circuit 602 operates conventionally, and is relatively easily understood. In the example of FIG. 6, and in previous and subsequent examples, a high voltage input signal is arbitrarily designated as logic state "1," and a low-or-no-voltage input signal is arbitrarily designated as logic state "0." When both input signal lines A and B are high, or are in logic state "1," then the vertical line 620 maintains a relatively high-voltage state, resulting in interconnection of vertical line 620 with output signal line 610 through the forward-biased diode 638, raising the voltage on output signal line 610. However, if either or both of signal lines A 604 and B 606 are in a relatively low-voltage, or no-voltage state, then forward-biased diodes 634 and 636 provide a low-impedance path for current to flow from line 620 to either or both of input signal lines A 604 or B 606. In the later case, the voltage potential of power line 620 falls to the relatively low-voltage or no-voltage state of either or both of input signal lines A 604 or B 606, and the output signal line 610 is therefore at ground. Since both input signal lines A and B must be in logic state "1" for output signal line 610 to be in logic state "1," the nanoscale circuit 602 outputs the logic state $A \wedge B$ on output signal line 610 in a response to signals input on signal lines A and B. Similar analysis of the remaining diode interconnections in the nanoscale circuit 602 reveals that output signal line 611 represents the logic state $\neg A \vee \neg B$, or $\neg(A \wedge B)$, and output signal line 612 outputs the same logic state as input to input signal line C 608.

The functionality of the nanoscale circuit shown in schematic form 602 can alternatively be represented in the block-diagram-like form 640, as shown in FIG. 6B. In the following discussion, the functionality of the conventional logic circuit, shown in FIG. 6A, is implemented in a nanowire crossbar, represented by the functional block shown in FIG. 6B, that employs impedance-encoded input from a preceding NIEL and outputs logic states stored in a following NIEL. While the functionality of the nanowire crossbar discussed below is identical to that of the conventional circuit shown in FIG. 6A, the implementation is different. For example, resistive connections 614–616 to ground 618 are not needed in the crossbar, instead provided by the NIELs. More importantly, input signals are not voltage encoded, as for the conventional circuit shown in FIG. 6A, but instead are impedance encoded within the preceding NIEL. Therefore, the nanowire crossbars within a cascade of nanowire crossbars interconnected through NIELs represent a new type of logic circuit that operates on impedance-encoded inputs and produces output voltage signals used either to store logic states in a following NIEL or as final voltage-signal outputs from a logic-circuit cascade.

Impedance-Driven Diode Logic

Figure 7:
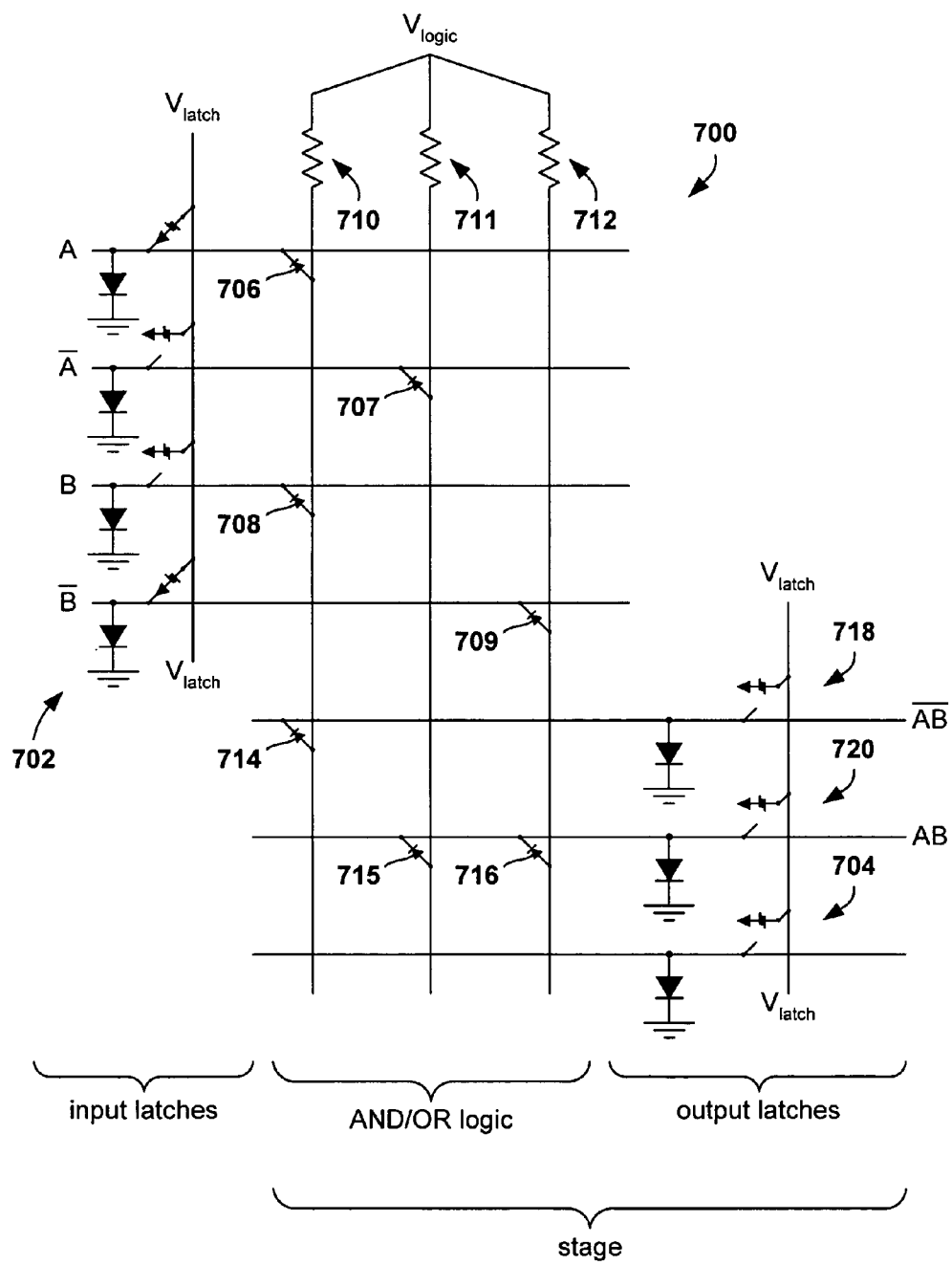
FIG. 7 shows an impedance-driven, nanoscale diode logic circuit interconnected to a preceding impedance-encoded nanoscale latch array and a following impedance-encoded nanoscale latch array.

Various embodiments of the present invention use NIDLCs tightly interwoven with NIELs. NIDLCs do not operate in the same way as conventional diode logic described previously. FIG. 7 shows a NIDLC interconnected to a preceding NIEL array 702 that drives its inputs and a following NIEL array 704 that captures its outputs. As shown in FIG. 7, inputs to an NIDLC 700 are driven from a preceding NIEL 702 or, in the case of primary inputs from an external source, from electrical equivalents. AND gates are implemented with diodes 706–709 and pullup resistors 710–712 in the top half of the crossbar, and OR gates with diodes 714–716 in the bottom half. The outputs of the OR gates 718 and 720 are driven into a following output latch 704. A NIDLC may be interconnected with one or more input NIELs and one or more output NIELs.

Differences between impedance-driven diode crossbar logic and conventional diode crossbar logic include: (1) input logic signals that are represented by either a high-impedance (logic 1) or low-impedance (logic 0) path to ground in impedance-driven diode crossbar logic, rather than by high or low voltages as in conventional diode crossbar logic; and (2) the apparent absence of pulldown resistors of conventional diode logic, but which are, in fact, supplied by the internal impedance of the output latches themselves. The AND/OR diode logic 700 along with one or more output latches 718 driven by the diode logic, but not any input latches, such as input latch 702 in FIG. 7, together constitute a stage. Note that the input latches for one stage are often output latches for another, preceding stage. The phrase "clocking a stage" refers to controlling a three-part process of reading input signals, computing one or more logic functions in the diode crossbar logic, and latching the results in the output latches. Controlling a clocking process comprises the following three steps:

(1) Initially setting all voltages applied to the circuit, including $V_{logic}$ at the pullup resistors interconnected with the crossbar and $V_{latch}$ at the input and output latches, to 0 V.

There is thus no power dissipation in the circuit, and the input latches are primed to be in output mode, ready for reading by the diode logic.

(2) Next, unconditionally opening the output latches by applying a sufficiently large positive voltage to $V_{latch}$, causing each latch to open if it was previously closed. $V_{latch}$ inputs to the output latches are then returned to 0 V.

(3) Next, applying a positive voltage to the $V_{logic}$ input of the logic circuit and a negative voltage to the $V_{latch}$ inputs of the output latches, while continuing to apply 0 V to the $V_{latch}$ inputs of any input latches. This causes the stage to compute the logic functions implied by the diodes present in the NIDLC, and to close each output latch if the computed value for the function associated with that latch evaluates to 1, while leaving each output latch open if the computed value for the function is 0. Note that the latches are inverting, storing a logic 1 when the input is a logic 0, and vice versa.

Figure 8A:
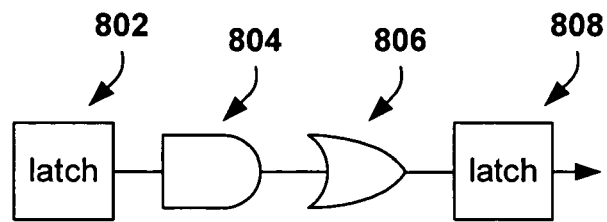
FIGS. 8A–C illustrate the impedance-encoded latches of this invention along with the simplest possible logic circuit utilizing the impedance-driven diode logic of this invention.
Figure 8B:
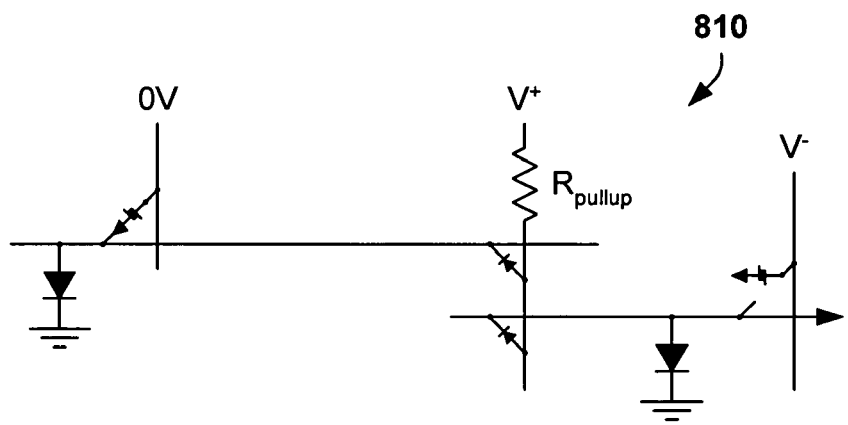
Figure 8C:
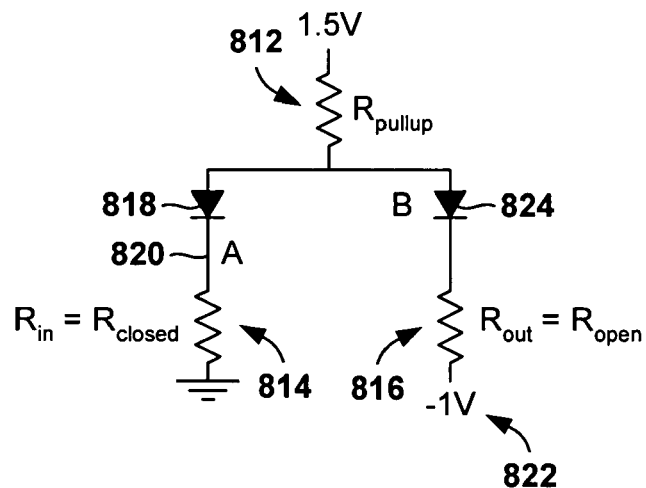

FIGS. 8A–C illustrate an example nanoscale circuit including two signal-element NIELs and a single NIDLC. FIG. 8A shows a simple schematic of the circuit, which includes a first, single-element NIEL 802, serial AND and OR gates 804 and 806 which together compose the NIDLC, and a second single-element NIEL 808. FIG. 8B shows a circuit-level representation 810 of the simple circuit illustrated in FIG. 8A. FIG. 8C shows a circuit equivalent to the circuit of FIGS. 8B and 8A under the assumption that the first NIEL 802 is prepared for output of stored values and that the second NIEL 808 is prepared to receive input from logic components 804 and 806. In FIGS. 8B–C, the positive and negative destruction voltages, $V_d^+$ and $V_d^-$, are assumed to be 2.5 V and −2.5 V, respectively, and the open and close voltages, $V_{open}$ and $V_{close}$, are assumed to be −1.5 V and 1.5 V, respectively. It is further assumed that the impedance of pull-up resistor 812 is intermediate in value between the impedances of the first nanoscale hysteretic resistor 814 and the second nanoscale hysteretic resistor 816. The voltage drop cross each diode is assumed to be 0.7 volts. It is further assumed that the voltage applied to the pull-up resistor 812 is 1.5 volts. Because of the voltage drop across diode 818, the voltage at point A, 820 is −0.7 V, providing a safety margin so that the latch is not opened when a driving voltage is applied to the NIDLC. Finally, the latch write voltage 822 is set to minus 1.0 volts, creating a maximum voltage drop across the second nanoscale hysteretic resistor 816 of 2.5V−$V_{diode}$.

Two cases need be considered. In a first case, the first latch 802 contains the logic value "1," or, in other words, is open. This implies a very small voltage drop across resistor 812, and that the voltage at both points A 820 and B 824 is 1.5 V−0.7V=0.8V. A voltage drop of 1.8V is therefore observed across the second nanoscale hysteretic resistor 816, which exceeds the switch threshold of the nanoscale hysteretic resistor, but is less than the destruction threshold. The second NIEL 808 is therefore forced to close. In a second case, the first NIEL 802 contains logic value "0." In this second case, there is little voltage drop across the first nanoscale hysteretic resistor 814, and all of the voltage crosses the resistor 812 and the two diodes 818 and 824. A voltage of 0.0 at points A and B 820 and 824 is therefore implied, in turn, implying that no voltage drop occurs across the first nanoscale hysteretic resistor 814 and that a voltage drop of 1.0 volts occurs across the second nanoscale hysteretic resistor 816. The voltage drop across the second nanoscale hysteretic resistor 816 is below the $V_{open}$ threshold, and the second NIEL 808 remains closed. In summary, the simple circuit illustrated in FIGS. 8A and 8B is operable within a range of voltages commensurate with the critical voltages for the nanoscale hysteretic resistors, and the nanoscale electronic circuit can be operated without producing sufficient voltage drops across the nanoscale hysteretic resistors to irreversibly destroy them.

FIGS. 9A–E illustrate operation of a single-crossbar, 2-latch nanoscale electronic circuit. The nanoscale electronic circuit shown in FIG. 9A combines a preceding 5-element NIEL array 902 identical to the NIEL discussed above, with reference to FIG. 5, a NIDLC 904 providing the logic functionality of the conventional logic circuit discussed above with reference to FIG. 8A, and a following 3-element NIEL 906 similar to the NIEL described above with reference to FIG. 5. The stored, impedance-encoded logic contents of the preceding 5-element NIEL array 902 are directed, as input, to the NIDLC 904, and logic output from the NIDLC is directed to the 3-element NIEL 906. As an initial condition, the first NIEL currently stores the logic value "10011," and the second NIEL currently stores the logic value "101." In a sequence of steps illustrated in FIGS. 9B–9C, the current content of the 5-element of the NIEL 902 are driven into the NIDLC 904 and the resulting output is stored in the 3-element NIEL 906. Then, in a sequence of steps illustrated in FIGS. 9D–9E, new input values are driven into the 5-element NIEL array 902. These sequences of steps may be repeated many times in a nanoscale-logic-circuit pipeline or state machine.

Figure 9A:
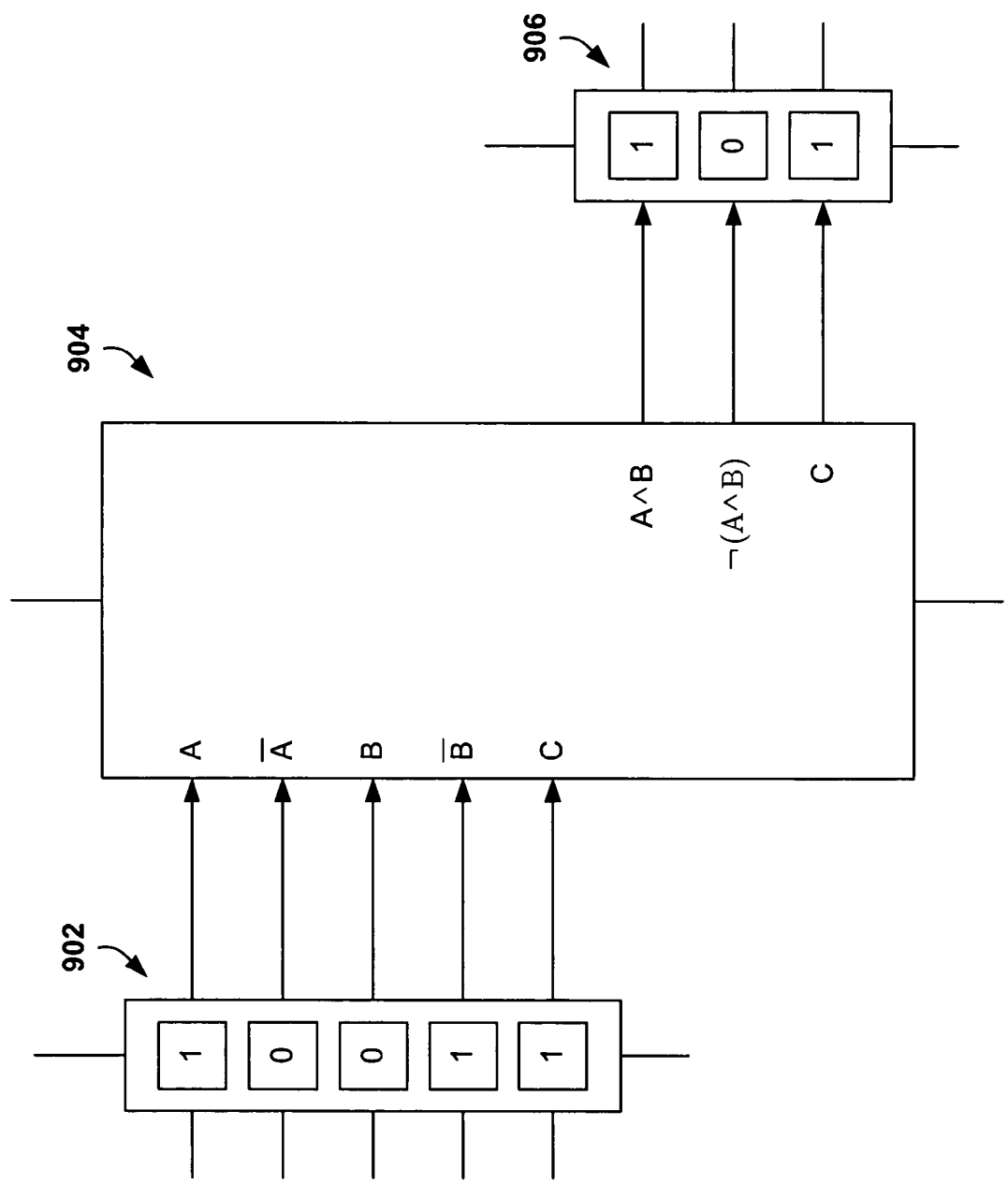
FIGS. 9A–E illustrate operation of a single-logic-circuit, 2-latch nanoscale electronic circuit.
Figure 9B:
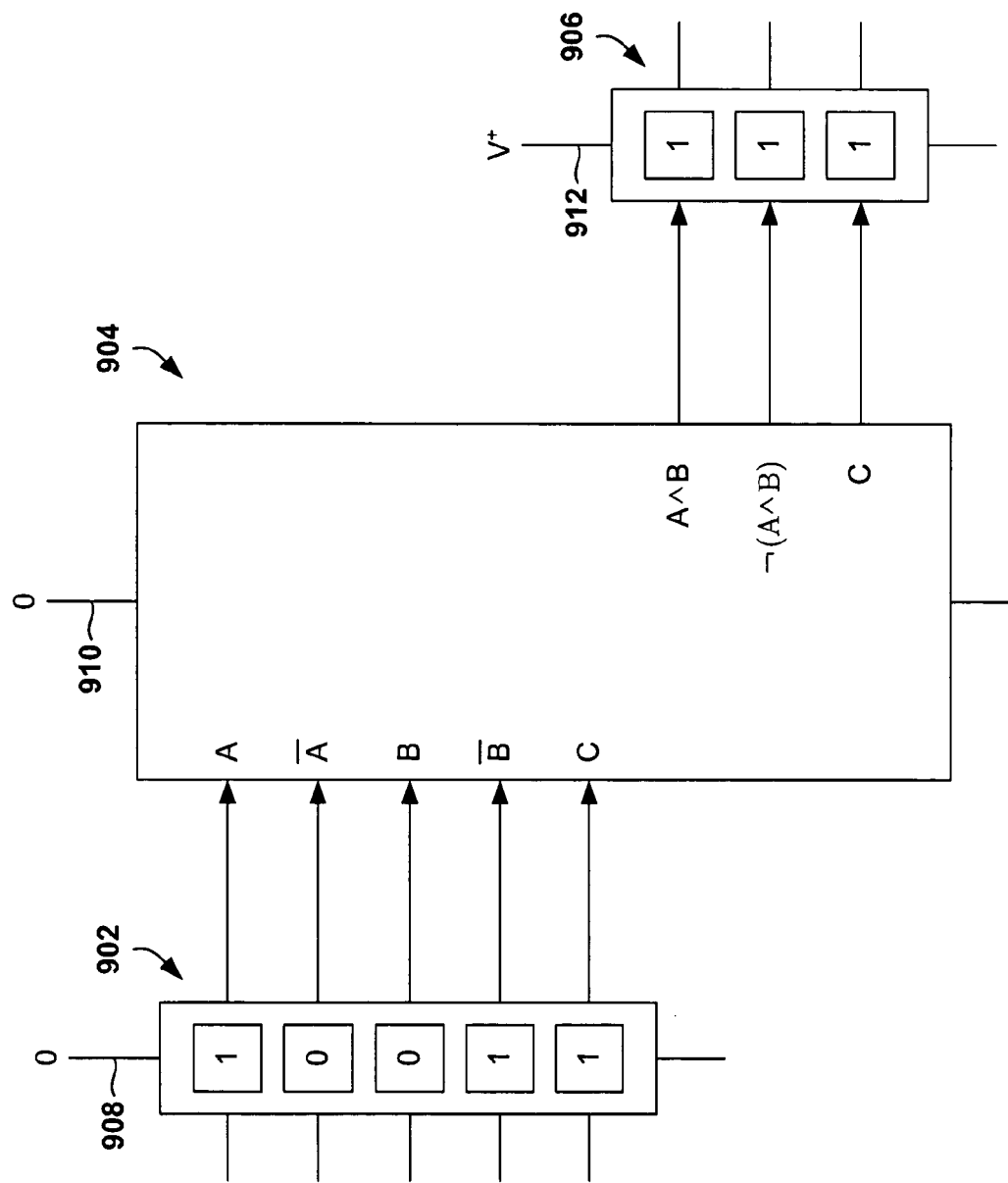
Figure 9C:
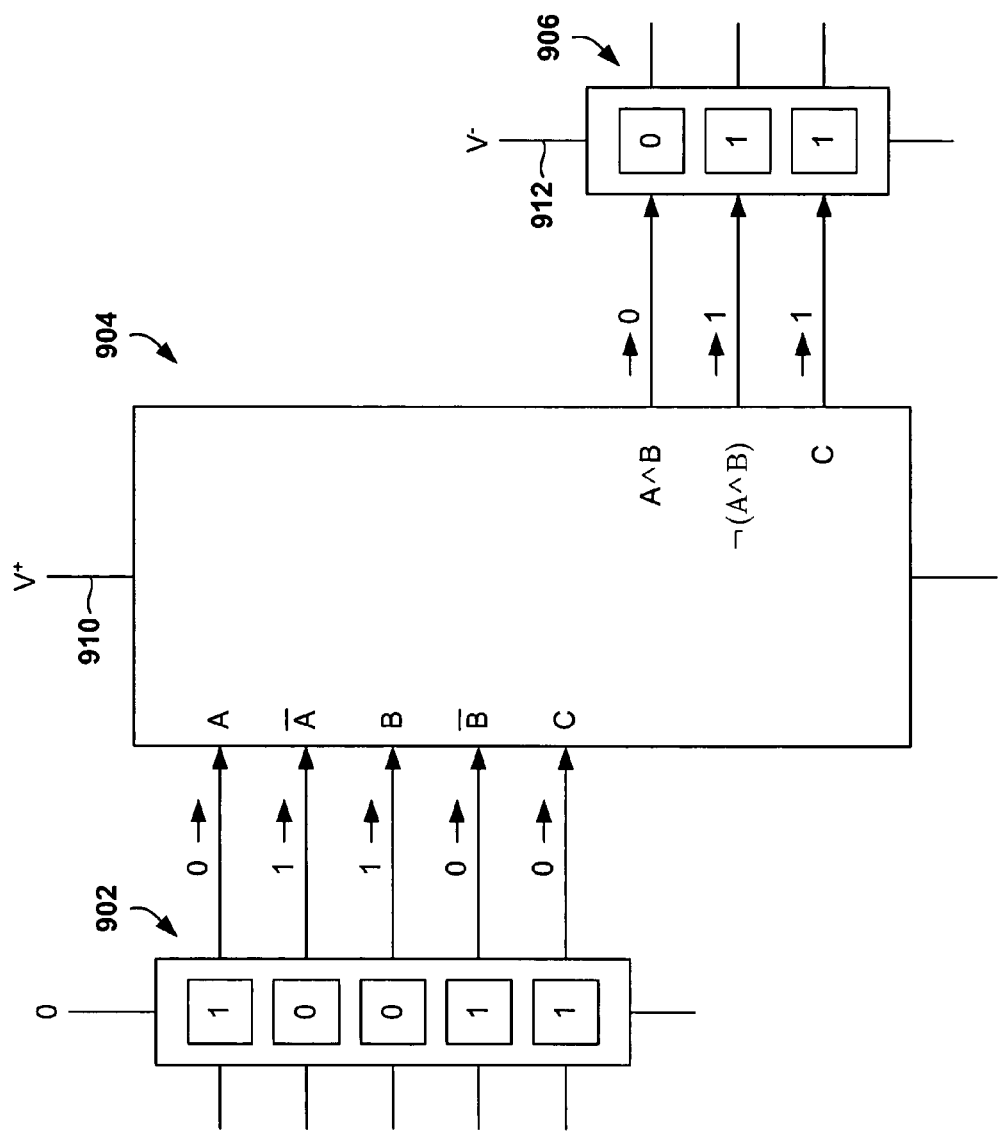

In a first step, shown in FIG. 9B, the control-voltage input 908 of the preceding 5-element NIEL array 902 is driven to ground, as is the driving voltage 910 input to the NIDLC 904. A sufficiently large, positive voltage is applied to the control-voltage input 912 of the following 3-element NIEL 906 so that the 5 internal latches are unconditionally opened. Thus, the following 5-element NIEL array is prepared for receiving input logic states from the NIDLC, clearing any previous impedance-encoded contents of the 3-element NIEL. Next, in the step shown in FIG. 9C, a positive driving voltage, or $V_{logic}$, is applied 910 to the NIDLC 904 and a negative voltage is applied to the control-voltage input 912 of the 3-element NIEL 906. This results in input of the impedance-encoded logic states from the preceding 5-element of the NIEL 902 into the NIDLC 904, which, in turn, produces output voltage circuits that set the impedance states of the internal latches within the following 3-element NIEL 906.

Figure 9D:
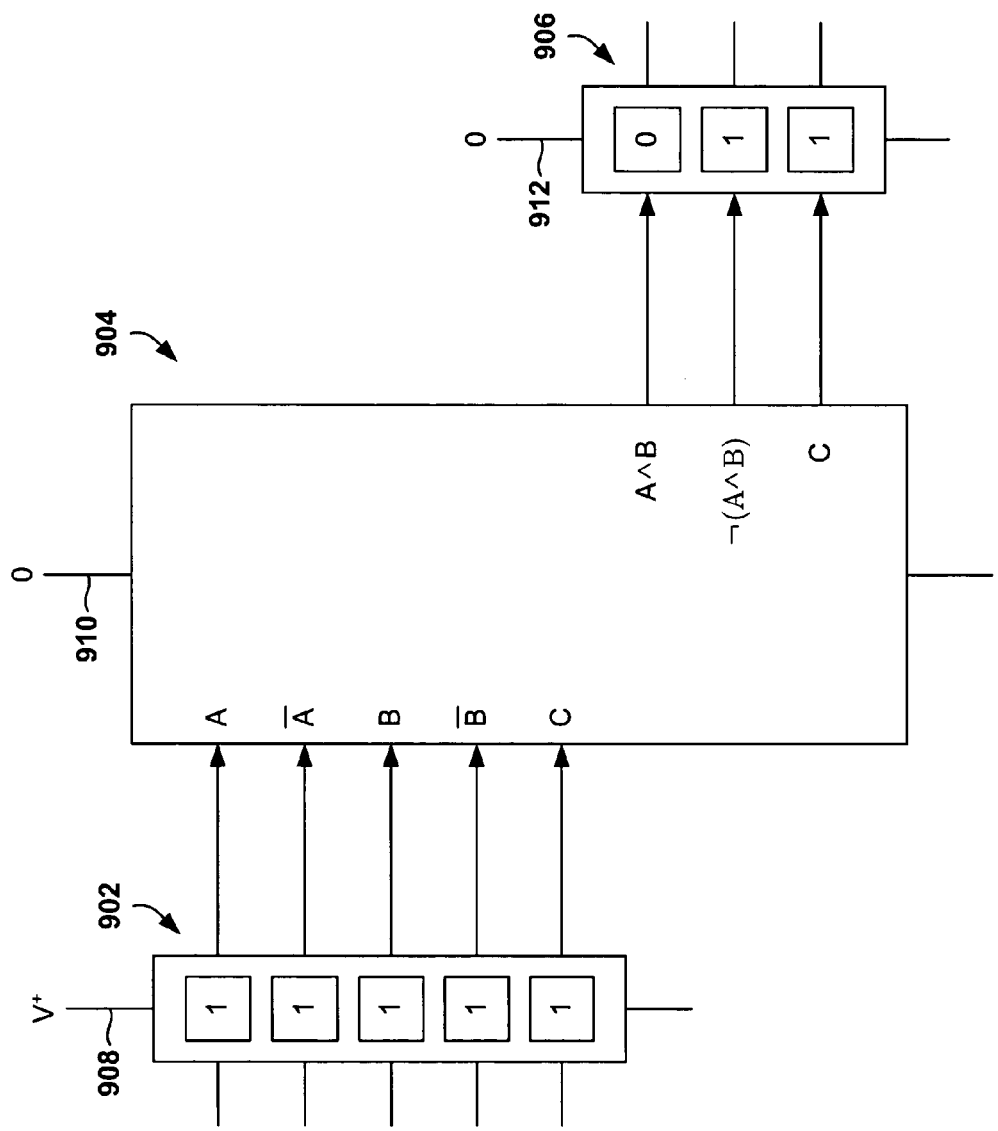
Figure 9E:
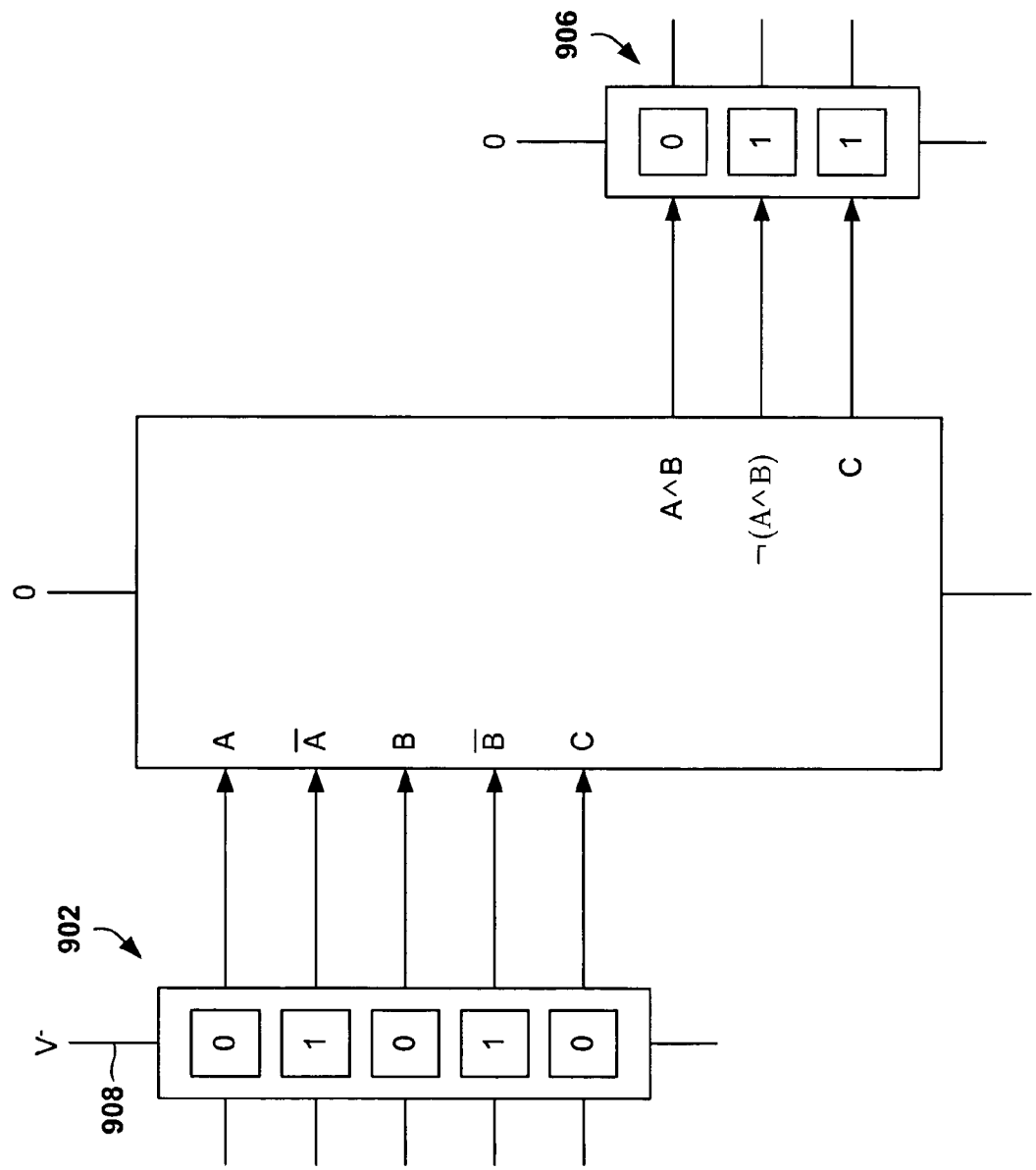

Next, in a step shown in FIG. 9D, the control-voltage input 912 for the following 3-element NIEL 906 is driven to ground, as is the driving voltage input 910 for the NIDLC 904. A positive voltage is applied to the control-voltage input 908 of the preceding 5-element latch 902 to clear the contents of the preceding 5-element NIEL array. In a final step, illustrated in FIG. 9E, a negative voltage is applied to the control-voltage input 908 of the preceding 5-element NIEL array 902 allowing the preceding 5-element NIEL array to receive a new input logic signal "01010." At this point, the steps shown in FIGS. 9B–C can be repeated to replace a second logic value into the 3-element NIEL 906.

It is important to note that operation of a NIEL voltage leads to logic-state inversion of a downstream signal line, the voltage state of which is influenced by the NIEL, with respect to the logic state of the signal line used to set the impedance state of the latch. As can be seen in FIGS. 4B–C, a relatively high-voltage input signal is used to set the NIEL in a closed, low-impedance state, while the low-impedance, closed state serves to draw a following, interconnected signal line to ground when a following nanowire crossbar is activated and the control-voltage input of the NIEL is forced to ground. Conversely, a low-voltage or ground-level signal input to the NIEL when the NIEL is placed in an input-signal-receptive state leaves the NIEL in an open, high-impedance state, while the high-impedance, open state does not affect the voltage-state of a following, interconnected signal line when a following nanowire crossbar is activated. Therefore, when the NIEL is viewed as a logic-state-storage device, the logic state stored via input of a logic "1" signal is read from the NIEL as a logic "0" state, and the logic state stored via input of a logic "0" signal is read from the NIEL as a logic "1" state.

Also, using NIELs that encode logic states as impedance states in series with cascaded logic circuits has a desirable effect of ameliorating cumulative voltage margin deterioration through the cascaded logic circuits, because each logic circuit is driven by a logic voltage input independently from the voltage margin output from a preceding logic circuit. In other words, rather than a cumulative voltage-margin decay through the cascaded logic circuits, only the voltage-margin compression due to the final logic circuit in the cascade is observed for the entire cascade. The input voltage margin is applied to each logic circuit in the cascade.

As discussed below, logic states may be coupled together in various different ways to form complex logic circuits. In such circuits, a NIEL array can be viewed as being interconnected with a preceding nanoscale crossbar and a following nanoscale crossbar. When the control-voltage input of the NIEL array is forced to ground, the $V_{logic}$ input of the preceding nanoscale crossbar forced to ground, and a positive voltage applied to the $V_{logic}$ input of the following nanoscale crossbar, as in FIG. 9C for the first NIEL array 902, the input/output signal lines of the NIEL array are in output mode. When a negative voltage is applied to the control-voltage input of the NIEL, with the latches in an open state, a positive voltage is applied to the $V_{logic}$ input of the preceding nanoscale crossbar, and the $V_{logic}$ input of the following nanoscale crossbar forced to ground, as in FIG. 9C for the second NIEL array 902, the input/output signal lines of the NIEL array are in an input mode. In other words, in order to propagate information in one direction through the NIEL array, both the control-voltage input to the latch and the $V_{logic}$ inputs to the preceding and following nanoscale crossbars must be clocked together. Care must be taken to operate a nanoscale electronic circuit containing NIELs, such as the NIEL array illustrated in FIG. 5, within the applied voltage ranges discussed with reference to FIG. 2.

Pipelines

Figure 10A:
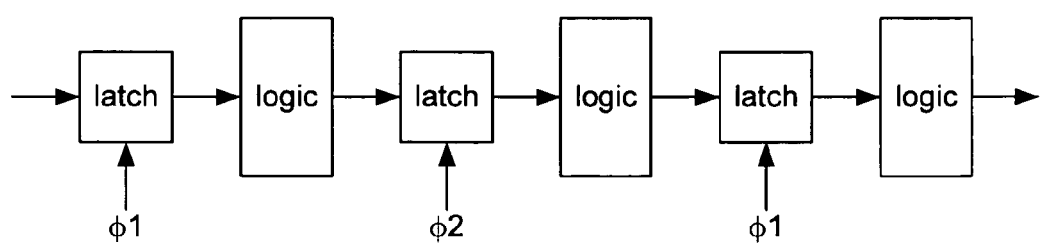
FIGS. 10A–B illustrate two of many different interconnection topologies facilitated by nanoscale latches.
Figure 10B:
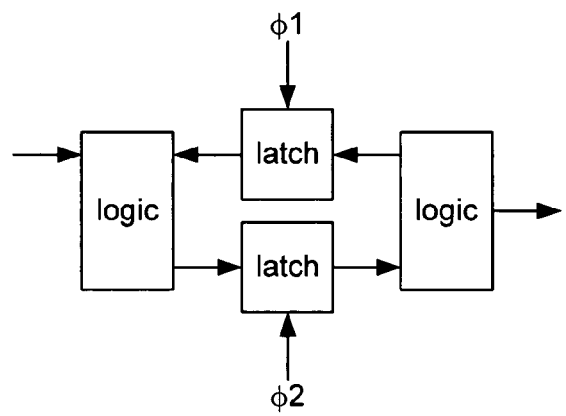

FIGS. 10A–B illustrate two of many different interconnection topologies facilitated by nanoscale latches. FIG. 10A illustrates a pipeline, one of many different interconnection topologies facilitated by NIELs. As discussed above, the pipeline can be clocked so that logic values are read from odd-numbered latches and input into even-numbered latches on a first clock cycle, and so that values can be read from even-numbered latches and input into odd-numbered latches on a second, subsequent clock cycle. After two clock cycles, logic values are transformed by a first NIDLC, stored in an intervening latch, and transformed by a second NIDLC for storing in a third latch. The pipeline allows numerous, small, NIDLCs to be combined, in series, in order to implement complex logic that is difficult or impossible to implement in a single, larger-scale logic device.

Pipeline Operation

Figure 11A:
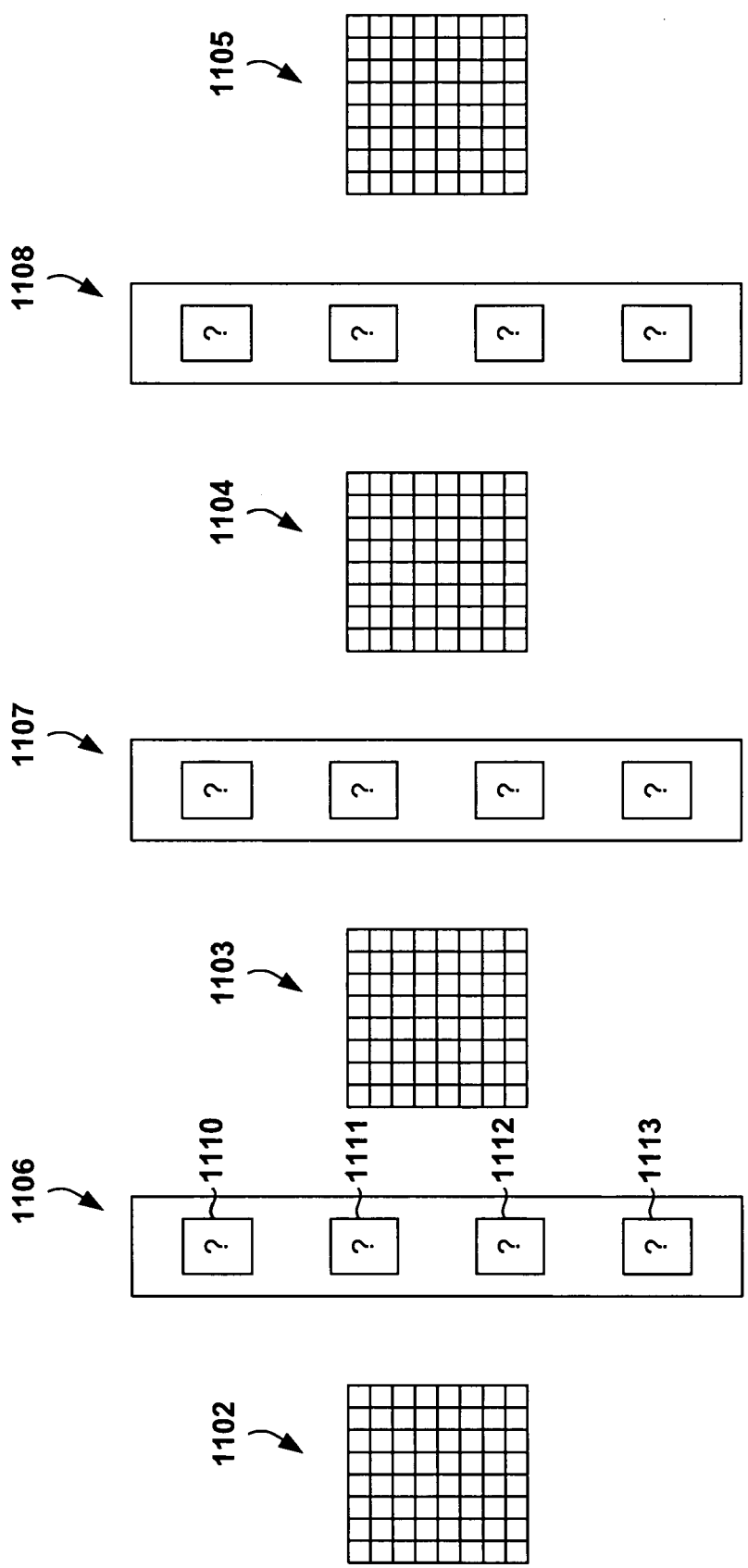
FIGS. 11A–D illustrate an approach, representing one embodiment of the present invention, for increasing the complexity of nanoscale impedance-driven logic circuits by using nanoscale impedance-encoded latches.

FIGS. 11A–D illustrate an approach, representing one embodiment of the present invention, for increasing the complexity of NIDLCs by using NIELs. In FIG. 11A, which uses the same illustration conventions as FIGS. 11B–D, four different NIDLCs 1102–1105 are interconnected through three NIELs 1106–1108 to cascade the logic operations represented by the four different NIDLCs. Collectively these four NIDLCs implement a logic function that is more complex than any one of the logic functions generated by each individual crossbar—this is accomplished by breaking down the desired (collective) function into a series of simpler logic stages. The four individual nanowire crossbars are of a size conducive for manufacturing and use, but are smaller than a nanowire-crossbar size that would be required to implement the desired collective function if implemented in a single stage of logic. The four nanowire crossbars cannot be directly interconnected (with the output of one stage driving the input of the next stage), because direct interconnection would lead to unacceptable signal degradation. In the example of FIGS. 11A–D, each NIEL, such as NIEL 1106, includes four elements for storing four different Boolean logic values 1110–1113.

Figure 11B:
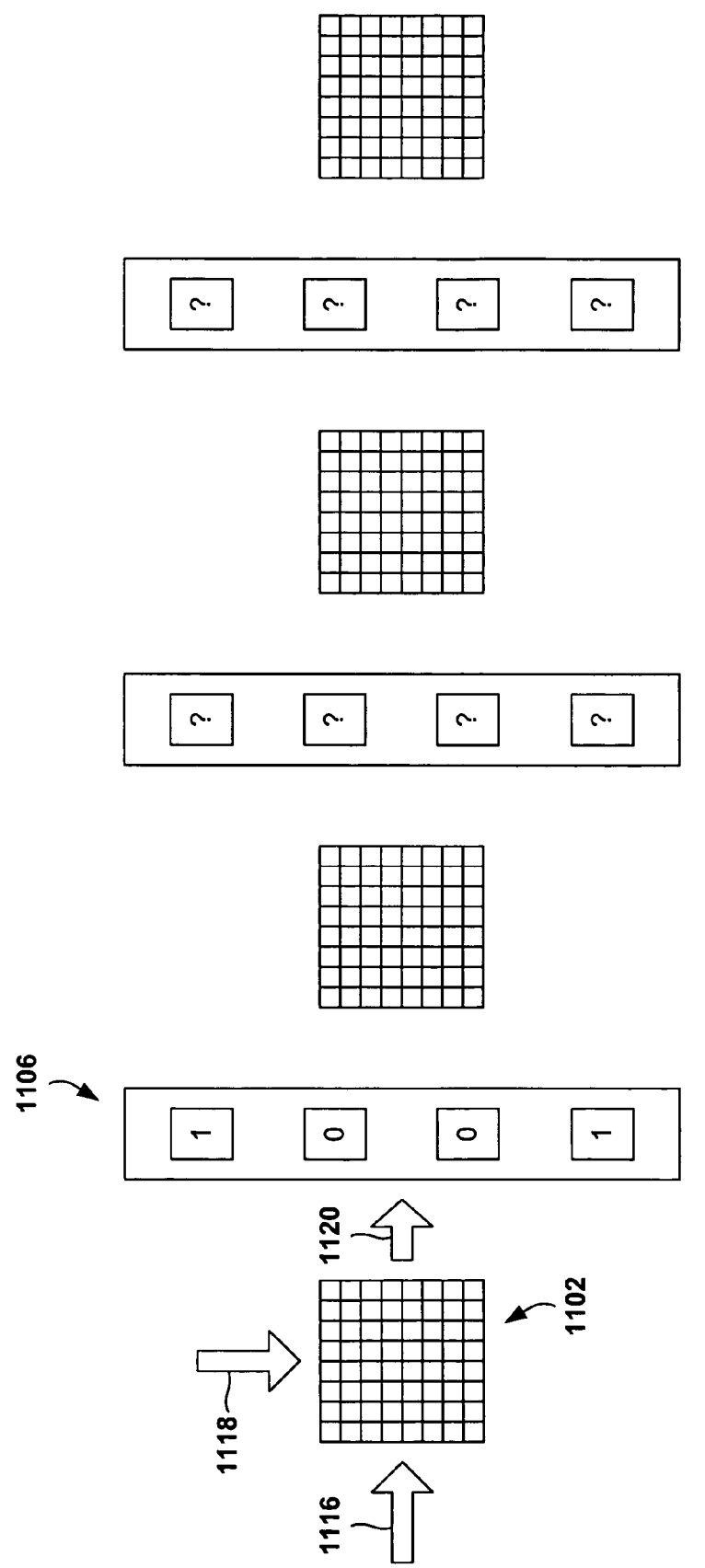
Figure 11C:
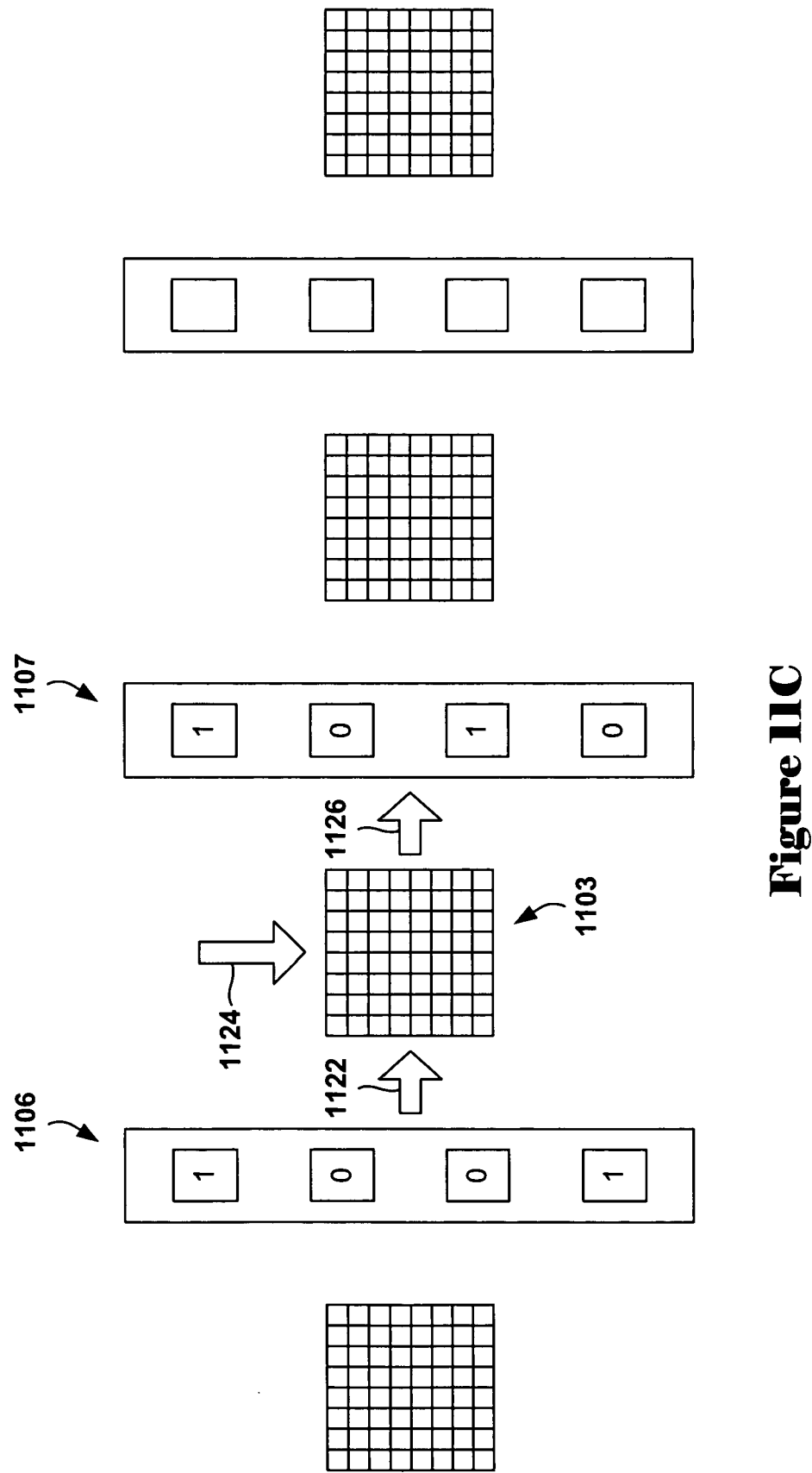
Figure 11D:
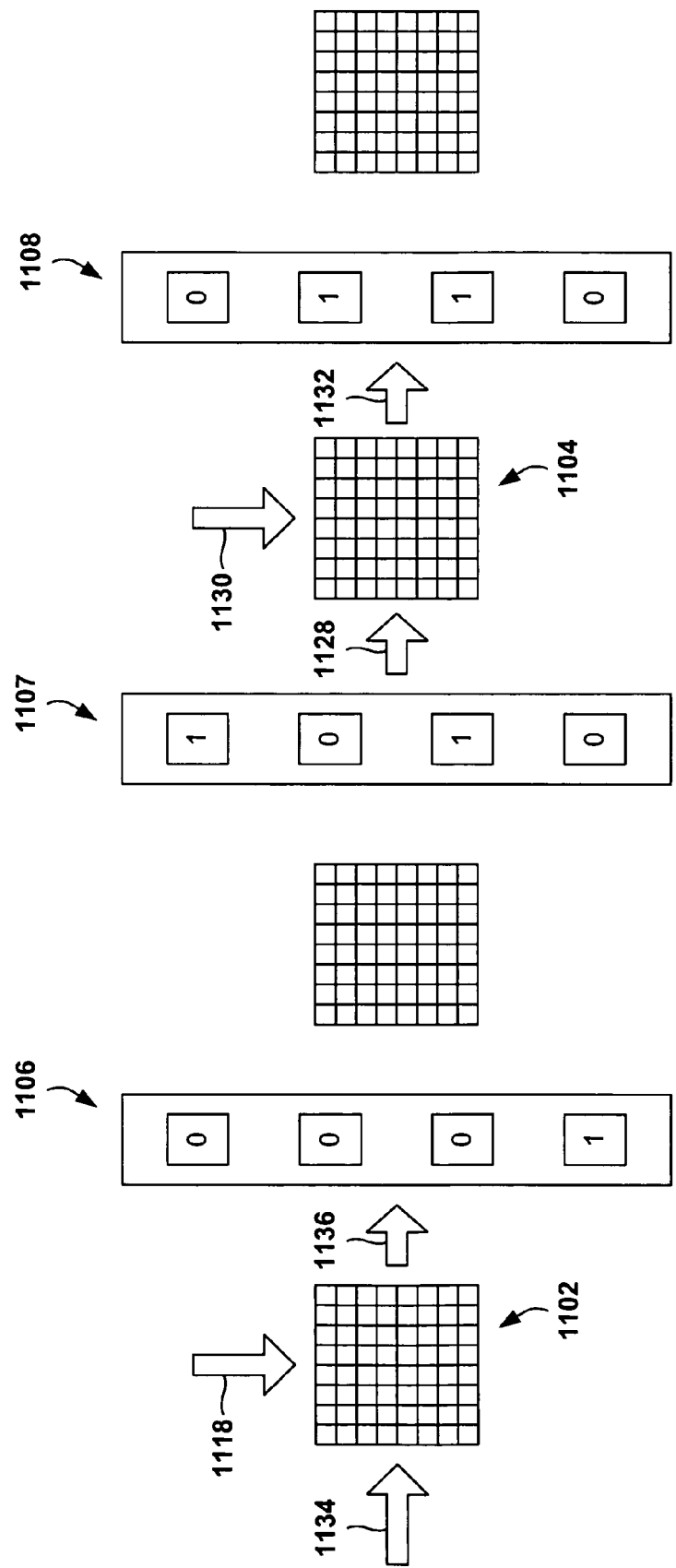

Operation of the four, cascaded nanowire crossbars interconnected through three NIELs is illustrated in FIGS. 11B–D. First, input signals 1116 and a logic voltage 1118 is applied to the first nanowire crossbar 1102 to generate an output signal 1120 which is stored in the first NIEL 1106 as logic value "1001," the NIEL having been prepared to receive the output signal by application of a positive close voltage $V_{close}$ [forward reference!] followed by a negative voltage less negative than an open voltage $V_{open}$, described below with reference to FIG. 2. As discussed below, input signals and a logic voltage are also applied to nanowire crossbar 1104 in this step, but, since no meaningful data has yet propagated to latch 1107, these operations are not shown in FIG. 11B. Next, as shown in FIG. 11C, the logic value stored in the first NIEL 1106 is used as input 1122 to the second nanowire crossbar 1103, powered by input logic voltage 1124, to produce a second output signal 1126 which is stored into the second NIEL 1107. A read voltage is applied to NIEL 1106 in this step, and NIEL is prepared for receiving signals output from nanowire crossbar 1103 by application of $V_{close}$ followed by application of a negative voltage less negative than an open voltage $V_{open}$. Again, similar operations are applied to nanowire crossbar 1105 in this step, but are not shown in FIG. 11C, since latch 1108 does not yet contain meaningful data. Next, as shown in FIG. 11D, the logic value stored in the second NIEL 1107 is used as input 1128 to the third nanowire crossbar 1104, powered by input logic voltage 1130, to produce a third output signal 1132 which is stored in the third NIEL 1108. At the same time, a new input signal 1134 is applied to the first nanowire crossbar 1102, along with input logic voltage 1118, to produce a new output signal 1136 that is driven into the first NIEL 1106. Again, the latches are also prepared for output and input, as discussed above. Each figure in the series of FIGS. 11B–D may represent a clock cycle. On one clock cycle, odd-numbered nanowire crossbars are powered in order to receive input signals from preceding NIELs, to which read voltages are applied, and to generate output signals stored in following NIELs, prepared for receiving the output signals by application of $V_{close}$ followed by application of a negative voltage less negative than an open voltage $V_{open}$. On a subsequent clock cycle, even-numbered nanowire crossbars are powered to receive input signals stored in preceding NIELs during the previous clock cycle and to output logic signals that are stored in following NIELs. Each nanowire crossbar and NIEL is thus clocked to produce a flow of computed values in one direction along the cascaded logic. Other types of interconnection topologies may be used to create state machines and arbitrarily complex logic circuits derived from pipelines and state machines.

State Machines

FIG. 10B illustrates a simple, two-latch state machine. A state machine comprises a number of logic-value-containing latches interconnected with one another through logic circuits. As a state machine is clocked, the value stored in latches change in a deterministic fashion. A combination of pipelines and state machines can produce any arbitrary desired logic circuit.

State Machine Example

Figure 12:
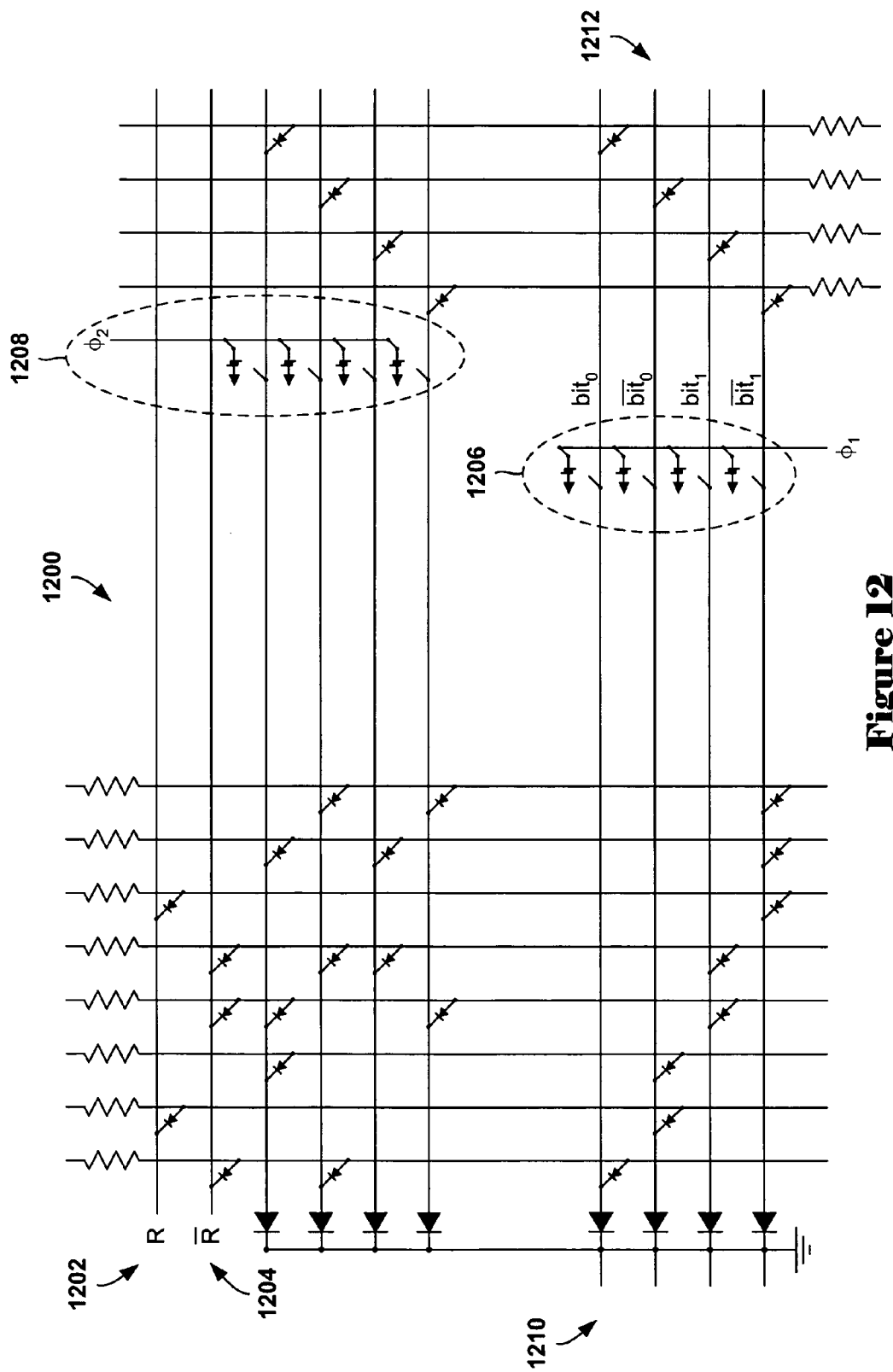
FIG. 12 shows a schematic illustration of an example state machine implemented with impedance-driven nanowire-crossbar-diode logic circuits and impedance-encoded nanoscale latches.

FIG. 12 shows a schematic illustration of an example two-bit-counter state machine implemented with NIDLCs and NIELs. The two-bit-counter state machine 1200 shown in FIG. 12 includes an input signal line R 1202 and its complement 1204, a first 4-element latch 1206, and a second 4-element NIEL 1208 interconnected by a first NIDLC 1210 and a second NIDLC 1212.

Example State Machine Operation

Figure 13A:
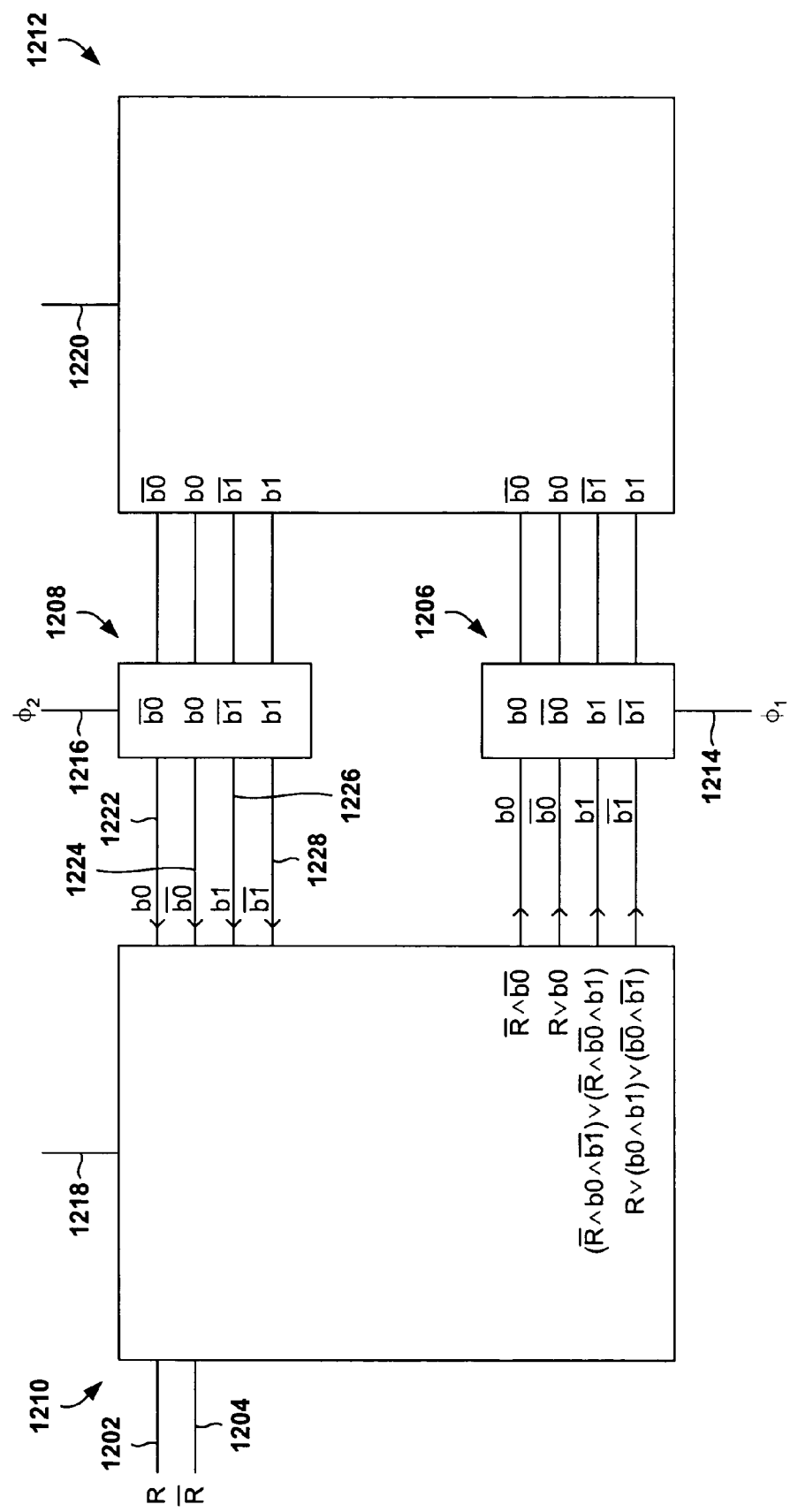
FIGS. 13A–J illustrate operation of the nanoscale state machine illustrated in FIG. 12.

FIGS. 13A–J illustrate operation of the nanoscale state machine illustrated in FIG. 12. FIG. 13A shows a block-diagram-like representation of the nanoscale state machine shown in FIG. 12. The block-diagram-like representation shows the R 1202 and complimentary $\overline{R}$ 1204 input signal lines, the first NIDLC 1210, the second NIDLC 1212, the first latch 1206, and the second latch 1208. Input control-voltage paths are shown for the first and second latches 1214 and 1216. Logic voltage inputs 1218 and 1220 are shown for the first 1210 and second 1212 NIDLCs. In FIGS. 13A–J, the Boolean expressions for logic-circuit output and input signals are explicitly shown, and correspond to the diode logic shown in FIG. 12. Note that, expressed above, the latches invert stored logic values on output, indicated in FIGS. 13A–J by inversion of the expressions for the input to, and output from, each NIEL. The two bits of the two-bit counter include bit 0 1222 and its complement 1224 and bit 1 1226 and its complement 1228. The state machine operates to change the values of the two bits, "b0" and "b1," in order to repeatedly count through the two-bit, binary values "00", "01," "10" and "11" that correspond to decimal numerals "0," "1," "2," and "3." The input signal R 1202, when high, serves to reset the state machine. As discussed above with reference to FIGS. 6A–C and 9A–E, logic states input into a NIEL are inverted, when read from the NIEL. Thus, in FIG. 13A, the first NIEL 1206 receives and stores logic states b0, ¬b0, b1, and ¬b1, in descending order from top internal latch to bottom internal latch, but outputs impedance states corresponding to logic states ¬b0, b0, ¬b1, and b1, in descending order from top internal latch to bottom internal latch.

Figure 13B:
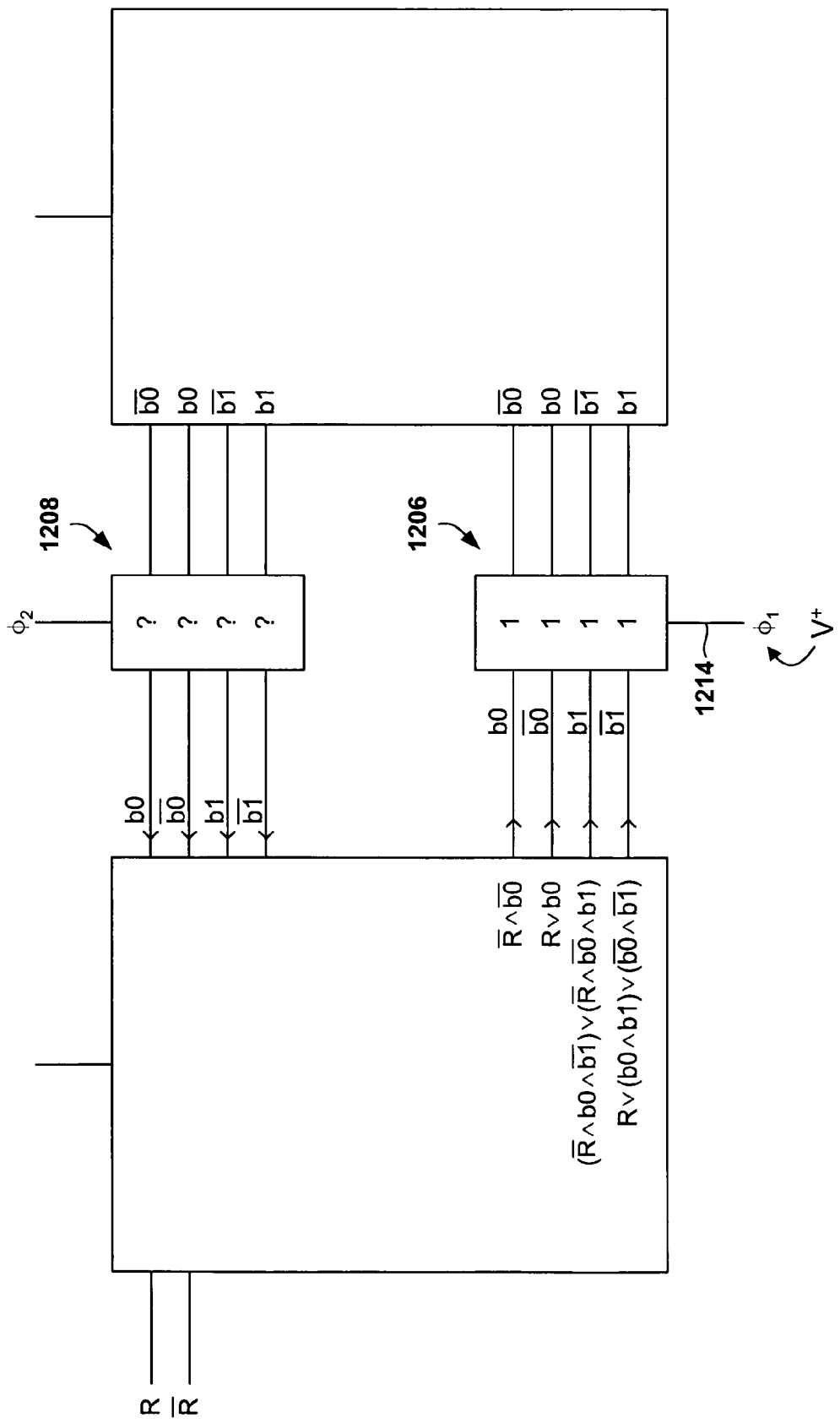
Figure 13C:
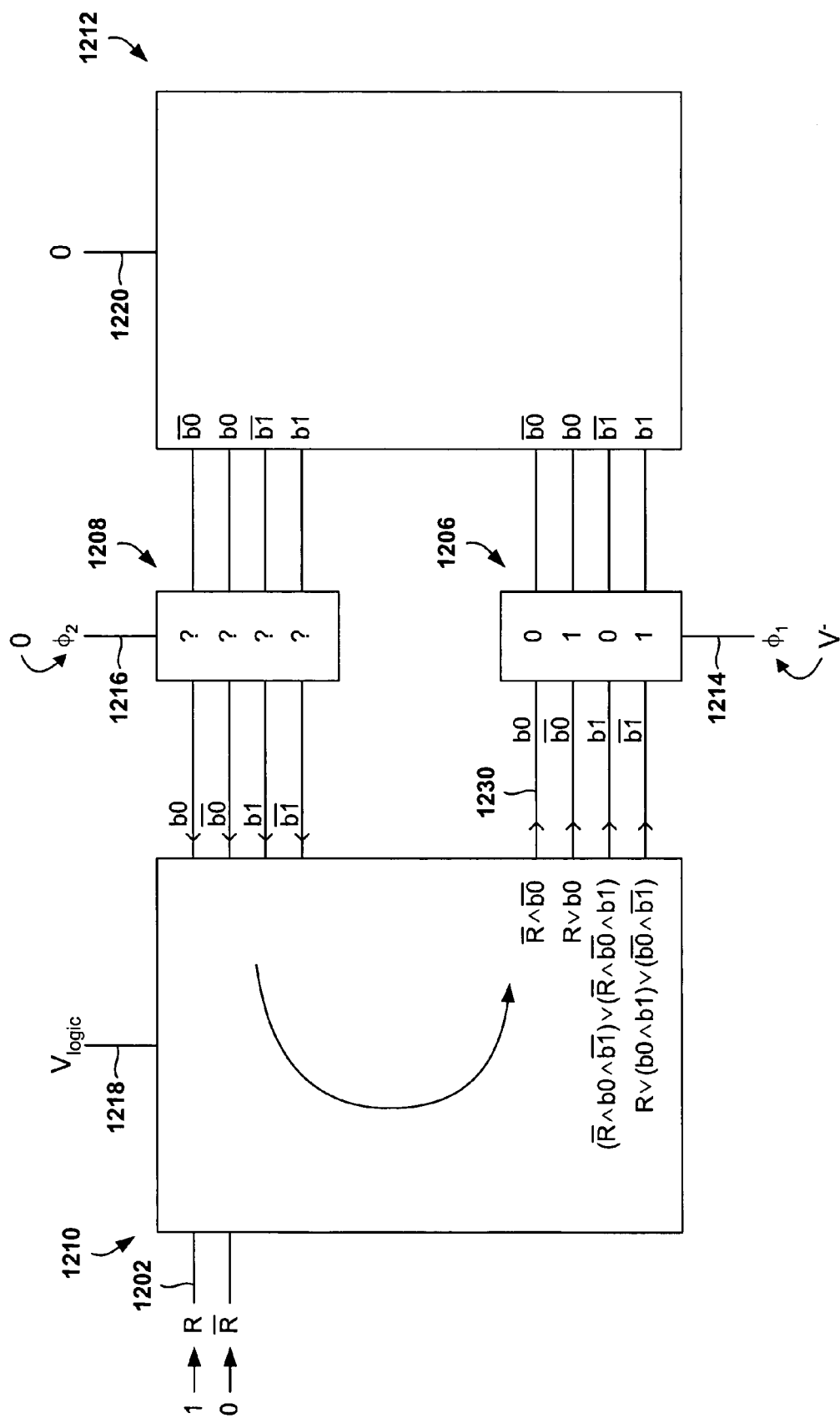
Figure 13D:
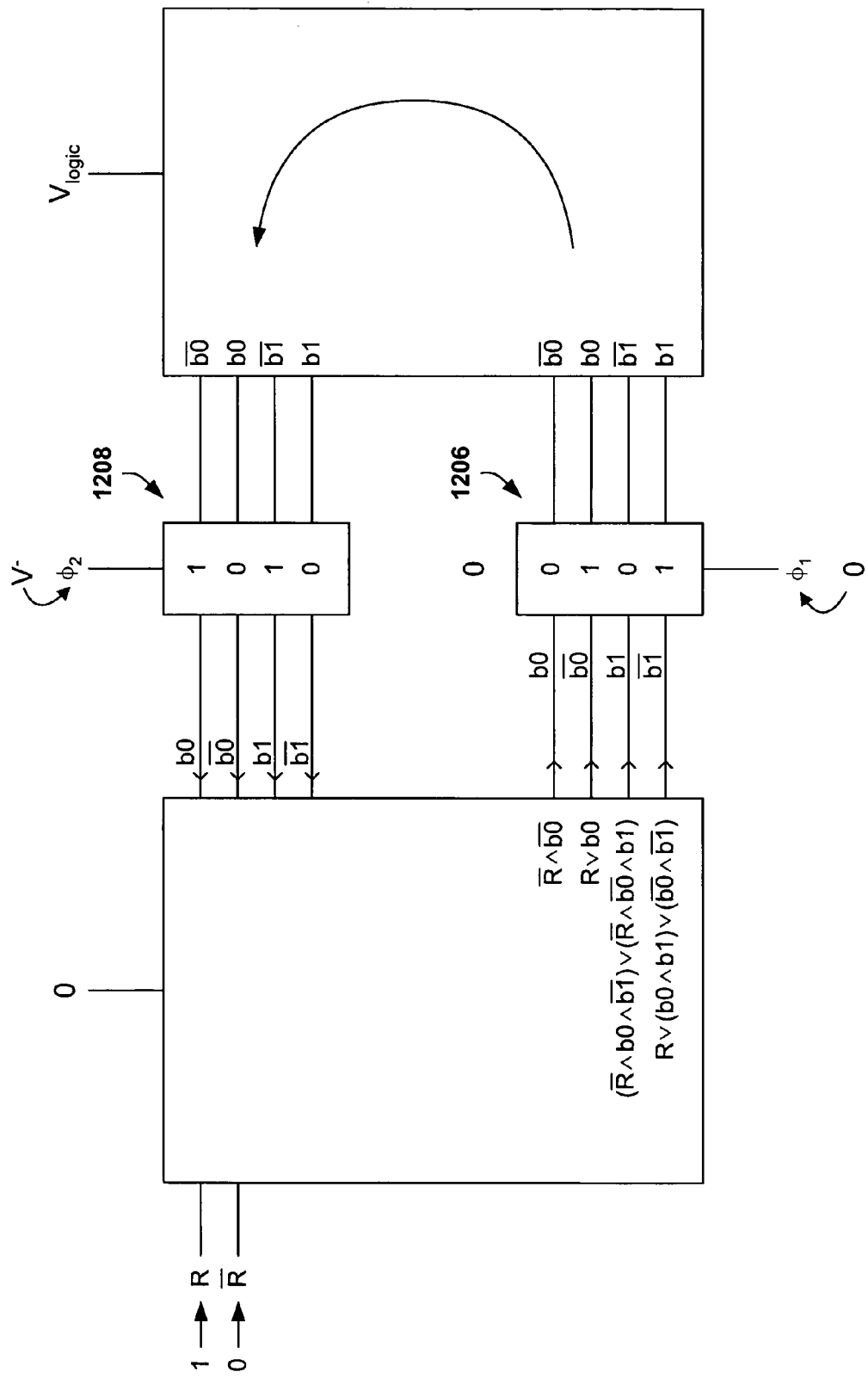

FIGS. 13B–D illustrate reset of the 2-bit-counter nanoscale state machine illustrated in FIGS. 12 and 13A. Initially, the values in the second latch 1208 are not known, and the first latch 1206 is cleared by application of positive voltage to the control-voltage input 1214, as discussed above. Note that this latch-clearing step is not shown in the subsequent sequence of steps in FIGS. 13C–J.

Next, in FIGS. 13C, logic value "1" is applied as a voltage potential to input R 1202 at the same time that logic voltage is supplied to the driving voltage input 1218 of the first NIDLC 1210, a negative voltage is applied to the control-voltage input 1214 of the first latch 1206, and the control-voltage input of the second latch 1208 is driven to ground, as is the driving voltage input 1220 of the second NIDLC 1212. This results in whatever values are stored in the second latch 1208 being input, along with input R, into the first NIDLC 1210, producing the Boolean value "0101" output to, and stored in, the first latch 1206. The logic value "0101" can be easily derived from the Boolean expressions representing the outputs of the first NIDLC 1210. As one example, output b0 1230 is low because the complement to signal R, $\overline{R}$, is high, forcing the Boolean logic expression ¬(R∨b0) to Boolean value "0."

Next, in the step shown in FIG. 13D, the input control voltages are inverted to retrieve the inverted logic state from the first latch 1206 and copy the inverted logic state "1010" into the second latch 1208. Note that the numeric value of the binary number stored in the first latch 1206 is now "0." At this point, the reset is complete.

Figure 13E:
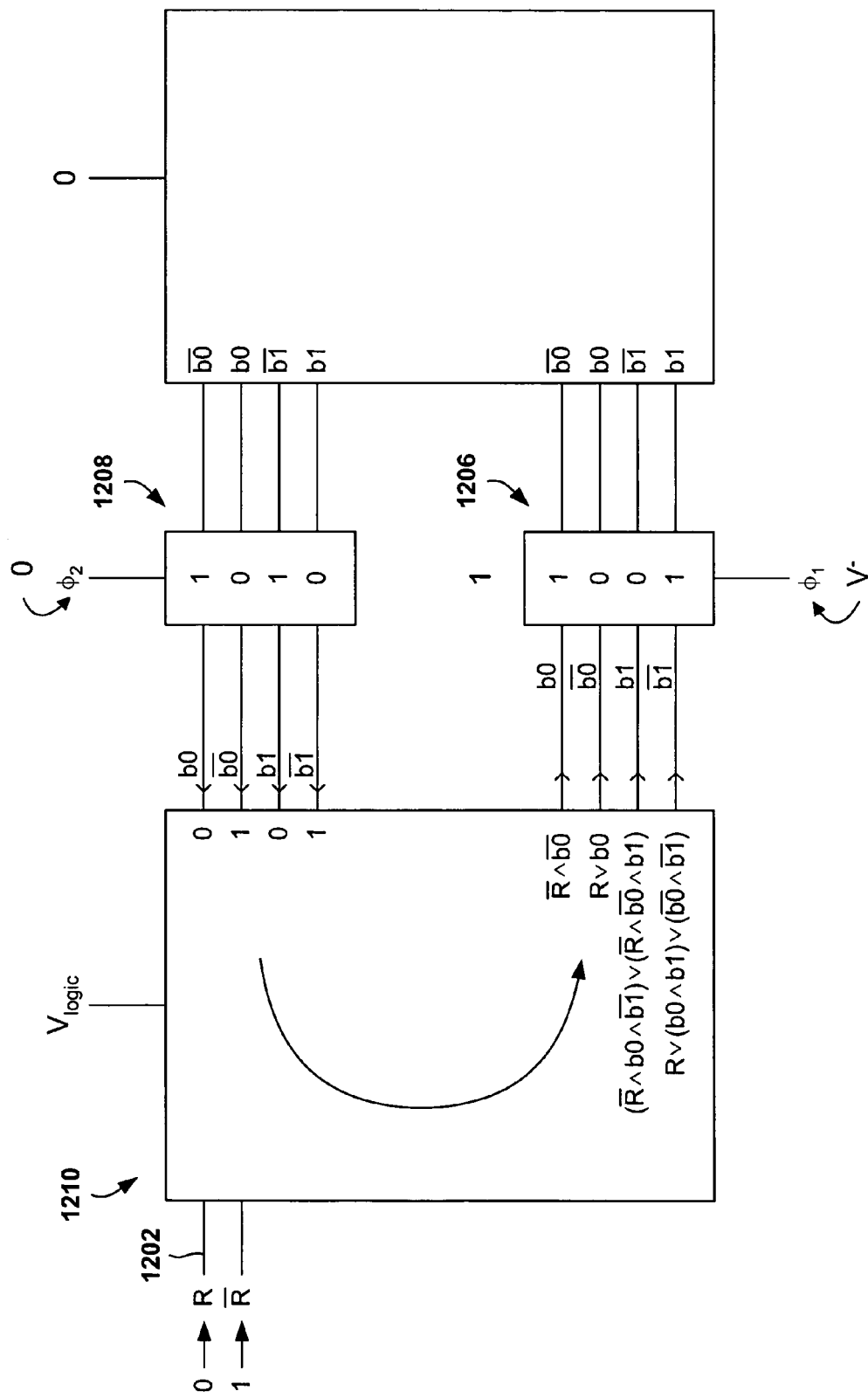
Figure 13F:
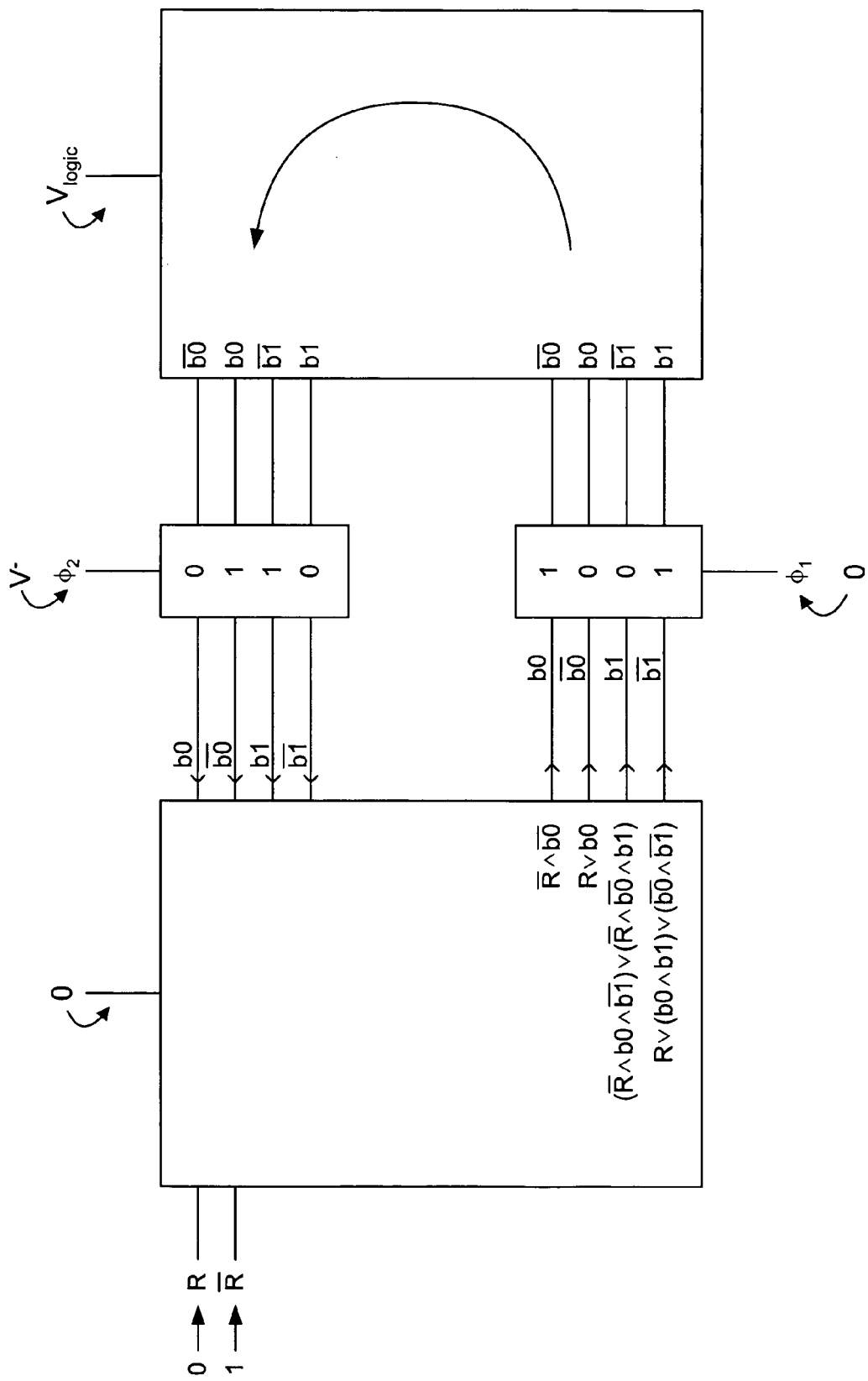
Figure 13G:
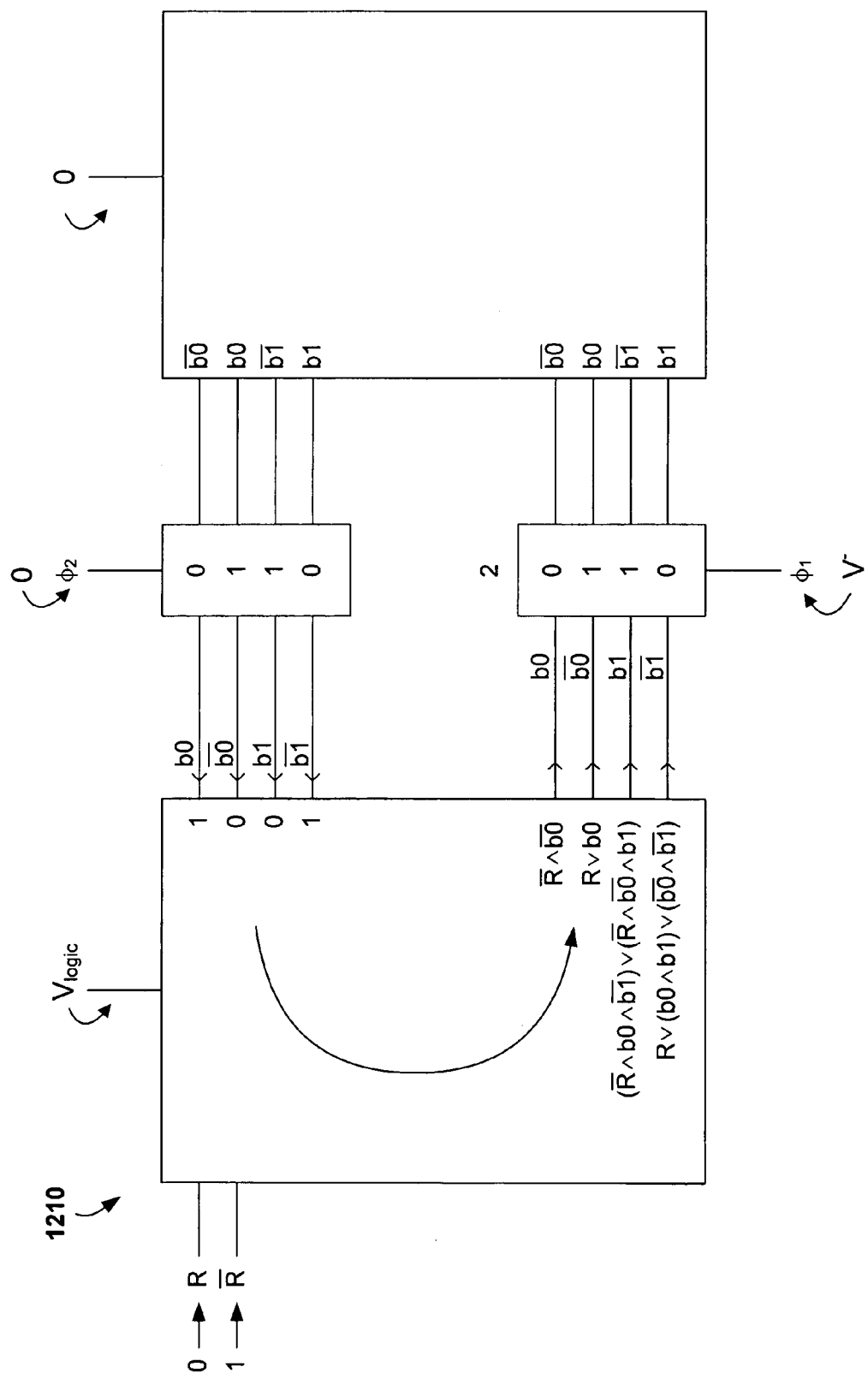
Figure 13H:
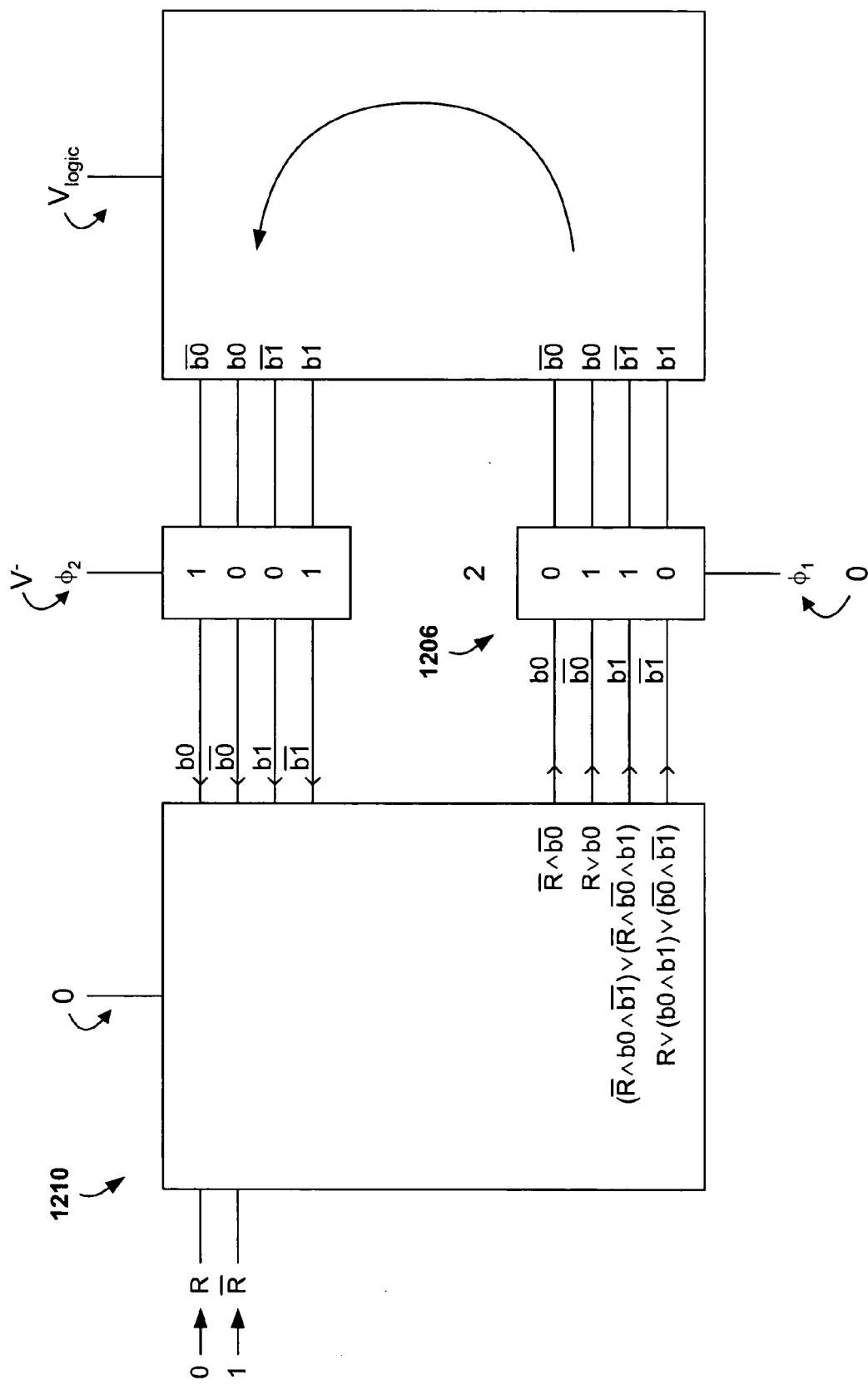
Figure 13I:
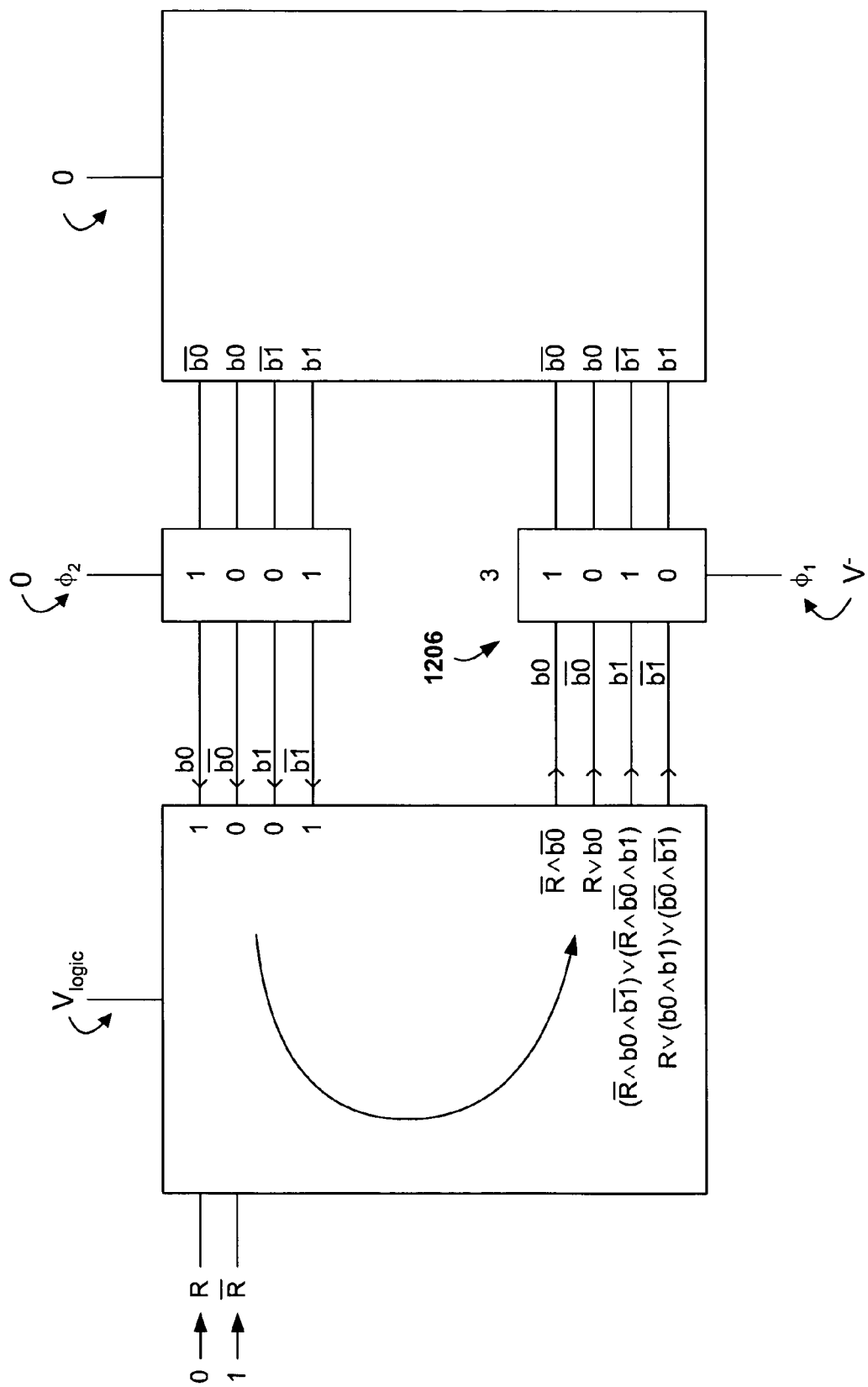
Figure 13J:
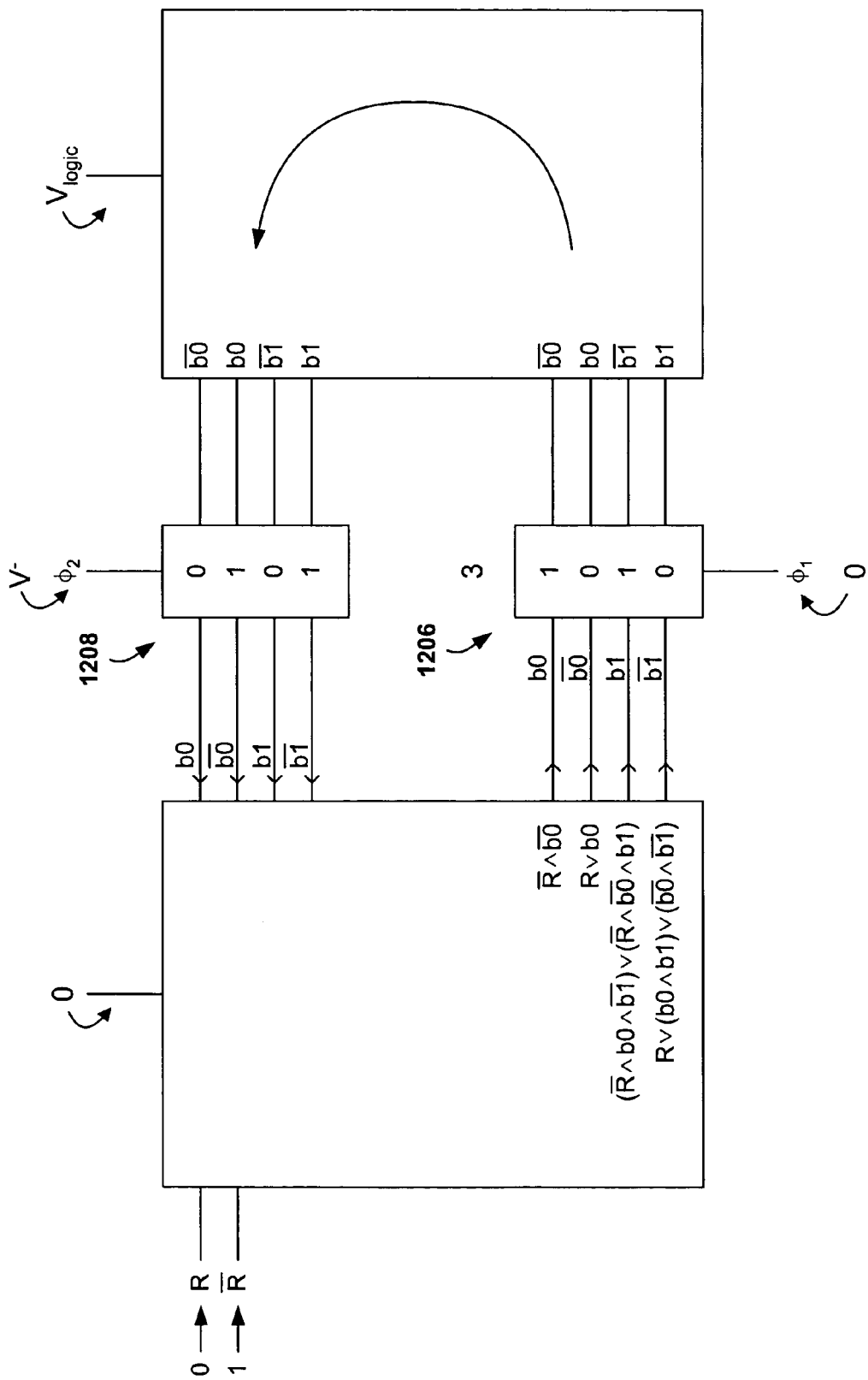

FIGS. 13E–J illustrate of the operation of the state machine to place numeric values "1," "2," and "3" into the first latch, with the subsequent cycles starting the count over again with numeric value "0" as the first value of the cycle stored in the first latch. In FIG. 13E, and in subsequent figures, the Boolean value "0" is input as a low-or-no voltage to signal line R 1202. The first NIDLC 1210 is powered to input the value stored in the second latch 1208 into the first NIDLC and output values to the first latch 1206. The resulting value stored in the first latch is the numeric value "1." A second cycle moves the contents of the first latch to the second latch, shown in FIG. 13F, and inputs values from the second latch back to the first NIDLC 1210 to produce a numeric value "2." A subsequent cycle moves the contents from the first latch to the second latch, shown in FIG. 13H, and inputs those values back into the first NIDLC 1210 to produce the value "3" stored in the first latch 1206, as shown in FIG. 13I. Finally, as shown in FIG. 13J, the control voltage inputs are inverted in order to move the numeric value "3," in inverted form, to the second latch 1208. The state shown in FIG. 13J prepares the state machine, in a next step, to place the value "0" into the first latch 1206, currently storing a value "3," to start the counting cycle all over again.

Although the present invention has been described in terms of a particular embodiment, it is not intended that the invention be limited to this embodiment. Modifications within the spirit of the invention will be apparent to those skilled in the art. Different molecular-junction-fabricated hysteretic resistors may exhibit different current/voltage curves, and may open or close in response to application of voltages of a different sign and magnitude than those described above. As discussed above, circuits of arbitrary complexity can be fashioned from NIELs and NIDLCs.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale latch that stores a logical value, the nanoscale latch comprising:

a nanoscale control-voltage input line;
a nanoscale input/output signal line; and
a nanoscale hysteretic resistor linking the control-voltage input to the input/output signal line that represents a first logic value when in a low-impedance, closed state and that represents a second logic value when in a high-impedance.

2. The nanoscale latch of claim 1 further comprising:
a nanoscale diode interconnecting the input/output signal line with ground to allow the latch to be nondestructively opened unconditionally.

3. The nanoscale latch of claim 2 further comprising:
a number of additional nanoscale input/output signals, each additional nanoscale input/output signal line interconnected to the nanoscale control-voltage input line by a separate nanoscale hysteretic resistor that stores a logical value and to ground through a nanoscale diode interconnection.

4. The nanoscale latch of claim 1 wherein application, to the nanoscale control-voltage input line, of a voltage of a first polarity greater in magnitude than a threshold voltage $V_o$ places the nanoscale latch into an open, high-impedance state.

5. The nanoscale latch of claim 4 wherein application, to the nanoscale control-voltage input line, of a voltage of a second sign greater in magnitude than a threshold voltage $V_c$ places the nanoscale latch into a closed, low-impedance state.

6. The nanoscale latch of claim 5 wherein a logical value is input to the nanoscale input/output signal line and stored in the nanoscale latch by:
applying a voltage of the first polarity equal or greater in magnitude than $V_o$ to the control-voltage input line to place the nanoscale latch into an open state;
applying a voltage of the second sign of a magnitude less than $V_c$ to the nanoscale control-voltage signal line, leaving the nanoscale latch in the open state; and
inputting a logic signal with a voltage of the first sign to the nanoscale input/output signal line to set the nanoscale latch to the closed state when the voltage of the logic signal combines with the voltage applied to the nanoscale control-voltage line to produce a combined voltage greater or equal in magnitude than $V_c$, and to leave the nanoscale latch in the open state when the voltage of the logic signal combined with the voltage applied to the nanoscale control-voltage line fails to produce a combined voltage greater or equal in magnitude than $V_c$.

7. The nanoscale latch of claim 5 wherein a logical value is read from the nanoscale latch by:
forcing the nanoscale control-voltage signal line to ground; and
disconnecting driven voltages on the input/output line through an isolation technique, such as by using unbiased diodes, and determining whether or not the applied voltage is drawn through a low-impedance path within the nanoscale latch to ground.

8. An impedance-encoded nanoscale logic circuit comprising:
a nanoscale latch, the nanoscale latch having a nanoscale control-voltage input line, a nanoscale input/output signal line, and a nanoscale hysteretic resistor linking the control-voltage input to the input/output signal line that represents a first logic value when in a low-impedance, closed state and that represents a second logic value when in a high-impedance;
a preceding nanowire crossbar with a logic-voltage input, and an output signal line interconnected with the nanoscale input/output signal line of the nanoscale latch for storing logic states into the nanoscale latch; and
a following nanowire crossbar with a logic-voltage input, and an input signal line interconnected with the nanoscale input/output signal line of the nanoscale latch for reading impedance-encoded logic states from the nanoscale latch.

9. Multiple impedance-encoded nanoscale logic circuits of claim 8 linked together to form a pipeline.

10. Multiple pipelines of claim 9 interconnected to form a complex logic circuit.

11. Multiple impedance-encoded nanoscale logic circuits of claim 8 linked together to form a state machine.

12. Multiple state machines of claim 11 interconnected to form a complex logic circuit.

13. One or more pipelines of claim 9 and one or more state machines of claim 11 interconnected to form a complex logic circuit.

14. The impedance-driven nanoscale logic circuit of claim 8 wherein a logic value is input into and stored by the nanoscale latch by:
forcing the logic-voltage inputs of the preceding and following nanowire crossbars to ground while applying voltages to the control-voltage input line of the nanoscale latch to place the nanoscale latch in an input receptive state;
applying a voltage to the logic-voltage input of the preceding nanowire crossbar; and
applying a voltage to the control-voltage input line of the nanoscale latch.

15. The impedance-driven nanoscale logic circuit of claim 8 wherein a logic value is read from the nanoscale latch by:
forcing the control-voltage input line of the nanoscale latch to ground, applying a voltage to the logic-voltage input of the following nanowire crossbar, and forcing the logic-voltage input of the preceding nanowire crossbar to ground, the nanoscale input/output signal line grounded through the nanoscale latch when the nanoscale latch is in a low-impedance state.

16. A method for constructing an impedance-encoded nanoscale logic circuit, the method comprising:
providing a nanoscale latch, the nanoscale latch having a nanoscale control-voltage input line, a nanoscale input/output signal line, and a nanoscale hysteretic resistor linking the control-voltage input to the input/output signal line that represents a first logic value when in a low-impedance, closed state and that represents a second logic value when in a high-impedance;
interconnecting the input/output signal line of the nanoscale latch with an output signal line of a first nanowire crossbar having a logic-voltage input to enable logic states generated by the first nanowire crossbar to be stored into nanoscale latch; and
interconnecting the input/output signal line of the nanoscale latch with a logic-voltage input of a second nanowire crossbar to enable impedance-encoded logic states from the nanoscale latch to be input into the second nanowire crossbar.

17. The method of claim 16 further including linking multiple impedance-encoded nanoscale logic circuits together to form a pipeline.

18. The method of claim 17 further including linking multiple pipelines together to form a complex logic circuit.

19. The method of claim 16 further including linking multiple impedance-encoded nanoscale logic circuits together to form a state machine.

20. The method of claim 19 further including linking multiple state machines together to form a complex logic circuit.

21. The method of claims 17 and 19 further including linking one or more pipelines and one or more state machines together to form a complex logic circuit.

* * * * *

UNITED STATES PATENT AND TRADEMARK OFFICE
CERTIFICATE OF CORRECTION

PATENT NO. : 7,242,215 B2
APPLICATION NO. : 10/974660
DATED : July 10, 2007
INVENTOR(S) : Gregory S. Snider et al.

Page 1 of 1

It is certified that error appears in the above-identified patent and that said Letters Patent is hereby corrected as shown below:

In column 8, line 3, delete "$\neg A_v {}_\wedge B$," and insert -- $\neg A_v \neg B$, --, therefor.

Signed and Sealed this

Sixth Day of October, 2009

David J. Kappos
*Director of the United States Patent and Trademark Office*